(12) United States Patent
Ishiguro et al.

(10) Patent No.: US 11,756,986 B2
(45) Date of Patent: Sep. 12, 2023

(54) ISOLATOR

(71) Applicants: Kabushiki Kaisha Toshiba, Tokyo (JP); Toshiba Electronic Devices & Storage Corporation, Tokyo (JP)

(72) Inventors: Akira Ishiguro, Oita Oita (JP); Ryohei Nega, Yokohama Kanagawa (JP); Yoshihiko Fuji, Oita Oita (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/677,610

(22) Filed: Feb. 22, 2022

(65) Prior Publication Data

US 2022/0173208 A1 Jun. 2, 2022

Related U.S. Application Data

(63) Continuation of application No. 17/014,306, filed on Sep. 8, 2020, now Pat. No. 11,296,185.

(30) Foreign Application Priority Data

Mar. 19, 2020 (JP) .................................. 2020-049484

(51) Int. Cl.
*H01L 23/00* (2006.01)
*H01L 23/522* (2006.01)
(Continued)

(52) U.S. Cl.
CPC ............. *H01L 28/10* (2013.01); *H01L 24/06* (2013.01); *H01L 23/5226* (2013.01); *H01L 27/0288* (2013.01)

(58) Field of Classification Search
CPC ..... H01L 23/48; H01L 23/5223; H01L 28/10; H01L 23/5226; H01L 24/06; H01L 25/26; H01L 27/0288; H01F 27/28
(Continued)

(56) References Cited

U.S. PATENT DOCUMENTS

| 7,343,668 B2 | 3/2008 | Kobayashi |
| 7,948,349 B2 | 5/2011 | Haratani et al. |

(Continued)

FOREIGN PATENT DOCUMENTS

| JP | 2007-87551 A | 4/2007 |
| JP | 4458149 B2 | 4/2010 |
| JP | 2010-258372 A | 11/2010 |

*Primary Examiner* — Thinh T Nguyen
(74) *Attorney, Agent, or Firm* — Allen & Overy LLP

(57) ABSTRACT

An isolator includes a first electrode; a first insulating portion on the first electrode; a second electrode on the first insulating portion; a second insulating portion around the second electrode; and a first dielectric portion on the second electrode and the second insulating portion. The second insulating portion is provided along a first plane perpendicular to a first direction from the first electrode toward the second electrode. The second electrode including a bottom surface facing the first insulating portion, an upper surface facing the first dielectric portion, a first side surface connected to the bottom surface, and a second side surface connected to the upper surface and the first side surface. The upper surface is wider than the bottom surface in a second direction along the first plane. The first side surface is tilted with respect to the bottom surface and the second side surface.

11 Claims, 27 Drawing Sheets

(51) Int. Cl.
*H01L 27/02* (2006.01)
*H01L 49/02* (2006.01)

(58) Field of Classification Search
USPC .......................... 257/238, 528, 531; 438/329
See application file for complete search history.

(56) References Cited

U.S. PATENT DOCUMENTS

| | | |
|---|---|---|
| 8,437,107 B2 | 5/2013 | Ide et al. |
| 8,786,393 B1 | 7/2014 | Chen |
| 9,214,424 B2 | 12/2015 | Stecher et al. |
| 9,780,161 B2 | 10/2017 | Menath et al. |
| 9,935,098 B2 | 4/2018 | Palumbo et al. |
| 9,941,565 B2 | 4/2018 | McLoughlin et al. |
| 10,199,370 B2 | 2/2019 | Palumbo et al. |
| 10,204,732 B2 | 2/2019 | Murphy et al. |
| 2018/0130867 A1 | 5/2018 | Lambkin et al. |
| 2018/0286802 A1 | 10/2018 | West et al. |
| 2022/0367603 A1* | 11/2022 | Tanaka ................... H01L 28/10 |

* cited by examiner

ISOLATOR

CROSS-REFERENCE TO RELATED APPLICATIONS

This application is a continuation of U.S. application Ser. No. 17/014,306 filed on Sep. 8, 2020 and is based upon and claims the benefit of priority from Japanese Patent Application No. 2020-049484, filed on Mar. 19, 2020; the entire contents of which are incorporated herein by reference.

FIELD

Embodiments relate to an isolator.

BACKGROUND

An isolator transmits a signal by utilizing the change of a magnetic field or an electric field in a state in which the current is blocked. It is desirable that breakdown of the isolator does not occur easily.

DETAILED DESCRIPTION

According to one embodiment, an isolator includes a first electrode; a first insulating portion provided on the first electrode; a second electrode provided on the first insulating portion; a second insulating portion provided around the second electrode; and a first dielectric portion provided on the second electrode and the second insulating portion. The second insulating portion is provided along a first plane perpendicular to a first direction from the first electrode toward the second electrode. The second insulating portion contacts the second electrode. The second electrode including a bottom surface facing the first insulating portion, an upper surface facing the first dielectric portion, a first side surface connected to the bottom surface, and a second side surface connected to the upper surface and the first side surface. The upper surface is wider than the bottom surface in a second direction along the first plane, the second direction being from a center of the second electrode toward an outer edge of the second electrode. The first side surface is tilted with respect to the bottom surface and the second side surface.

Embodiments will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

The same portions inside the specification and drawings are marked with the same numerals; and a detailed description is omitted as appropriate.

First Embodiment

Figure 1:
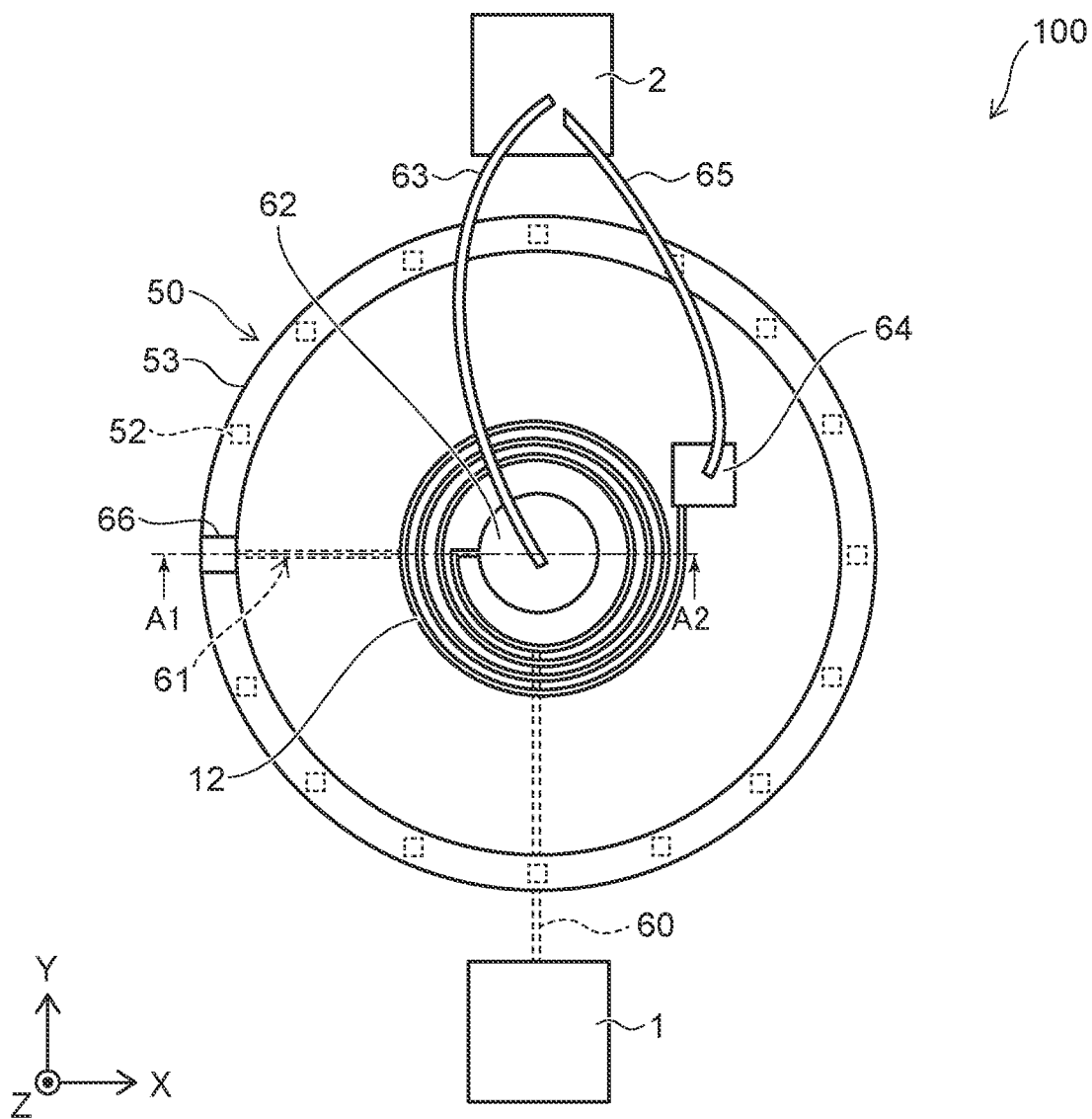
FIG. 1 is a plan view illustrating an isolator according to a first embodiment.

FIG. 1 is a plan view illustrating an isolator 100 according to a first embodiment.

Figure 2:
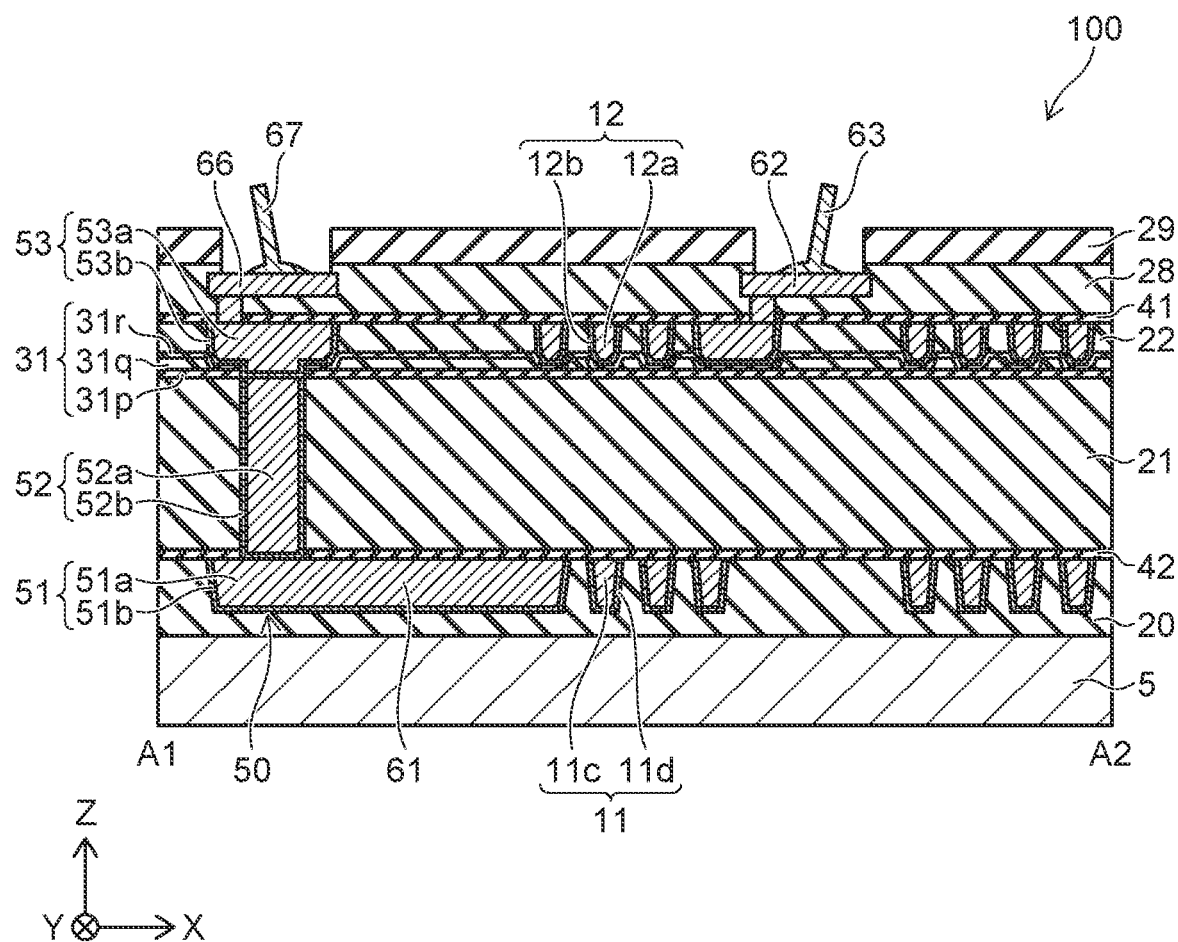
FIG. 2 is an A1-A2 cross-sectional view of FIG. 1.

FIG. 2 is an A1-A2 cross-sectional view of FIG. 1.

For example, the first embodiment relates to a device so-called a digital isolator, a galvanic isolator, or a galvanic isolation element. As illustrated in FIGS. 1 and 2, the isolator 100 according to the first embodiment includes a first circuit 1, a second circuit 2, a substrate 5, a first electrode 11, a second electrode 12, a first insulating portion 21, a second insulating portion 22, an insulating portion 28, an insulating portion 29, a dielectric portion 31, a dielectric portion 41, a dielectric portion 42, and a conductive body 50. The insulating portions 28 and 29 are not illustrated in FIG. 1.

An XYZ orthogonal coordinate system is used in the description of the embodiments. The direction from the first electrode 11 toward the second electrode 12 is taken as a Z-direction (a first direction). Two mutually-orthogonal directions perpendicular to the Z-direction are taken as an X-direction (a second direction) and a Y-direction (a third direction). In the description, the direction from the first electrode 11 toward the second electrode 12 is called "up", and the reverse direction is called "down". These directions are based on the relative positional relationship between the first electrode 11 and the second electrode 12 and are independent of the direction of gravity.

As illustrated in FIG. 2, an insulating portion 20 is provided on the substrate 5. The first electrode 11 is provided inside the insulating portion 20. The first insulating portion 21 is provided on the first electrode 11 and the insulating portion 20. The second electrode 12 is provided on the first insulating portion 21. The second insulating portion 22 is provided around the second electrode 12 along the X-Y plane (a first plane) perpendicular to the Z-direction. The second insulating portion 22 contacts the second electrode 12.

In the example illustrated in FIGS. 1 and 2, the first electrode 11 and the second electrode 12 are coils that are provided in spiral configurations along the X-Y plane. The first electrode 11 and the second electrode 12 face each other in the Z-direction. At least a portion of the second electrode 12 is arranged with at least a portion of the first electrode 11 in the Z-direction.

The dielectric portion 31 is provided between the first insulating portion 21 and the second insulating portion 22 in the Z-direction. At least a portion of the dielectric portion 31 is provided around the second electrode 12 along the X-Y plane.

The dielectric portion 31 contacts the second electrode 12. The dielectric portion 31 includes, for example, a first dielectric layer 31p, a second dielectric layer 31q, and a third dielectric layer 31r. The second dielectric layer 31q is provided between the first dielectric layer 31p and the third dielectric layer 31r. For example, the second dielectric layer 31q is different in the composition from the first dielectric layer 31p and the third dielectric layer 31r. As an example, the relative dielectric constants of the materials included in the first dielectric layer 31p and the third dielectric layer 31r are greater than the relative dielectric constant of the material included in the second dielectric layer 31q. The first dielectric layer 31p and the third dielectric layer 31r are different in the composition from the first insulating portion 21. As an example, the relative dielectric constants of the materials included in the first dielectric layer 31p and the third dielectric layer 31r are greater than the relative dielectric constant of the material included in the first insulating portion 21.

The dielectric portion 41 is provided on the second electrode 12 and the second insulating portion 22. For example, the dielectric portion 41 contacts the second electrode 12 and the second insulating portion 22.

The conductive body 50 is provided around the first electrode 11 and the second electrode 12 along the first plane. Specifically, the conductive body 50 includes a first conductive portion 51, second conductive portions 52, and a third conductive portion 53. The first conductive portion 51 is provided around the first electrode 11 along the X-Y plane. The second conductive portions 52 are provided on a portion of the first conductive portion 51. Multiple second conductive portions 52 are provided along the first conductive portion 51. The third conductive portion 53 is provided on the multiple second conductive portions 52. The third conductive portion 53 is provided around the second electrode 12 along the X-Y plane.

In the example illustrated in FIG. 1, one end of the first electrode 11 (i.e., one end of the coil) is electrically connected to the first circuit 1 via wiring 60. The other end of the first electrode 11 (i.e., the other end of the coil) is electrically connected to the conductive body 50 via wiring 61.

One end of the second electrode 12 (i.e., one end of the coil) is electrically connected to the second circuit 2 via a metal layer 62 and wiring 63. The other end of the second electrode 12 (i.e., the other end of the coil) is electrically connected to the second circuit 2 via a metal layer 64 and wiring 65. For example, the metal layer 62 is provided on the one end of the second electrode 12. The metal layer 64 is provided on the other end of the second electrode 12. Although, in this case, the metal layers 62 and 64 are provided at a level in the Z-direction that is different from the level of the second electrode 12 in the Z-direction, the metal layer 62 and the metal layer 64 may be provided at the same level in the Z-direction as the level of the second electrode 12 in the Z-direction. The metal layers 62 and 64 may be formed to have a continuous body with the second electrode 12.

As illustrated in FIG. 2, a metal layer 66 is provided on the conductive body 50. The conductive body 50 is electrically connected to a not-illustrated conductive member via the metal layer 66 and wiring 67. For example, the conductive body 50 and the substrate 5 are connected to a reference potential. The reference potential is, for example, a ground potential. The conductive body 50 can be prevented from having a floating potential by connecting the conductive body 50 to the reference potential. The likelihood of unexpected dielectric breakdown can be reduced thereby, which occurs between the conductive body 50 and the electrodes due to fluctuation of the potential of the conductive body 50.

Moreover, the substrate 5 may include a circuit that is electrically connected to the first electrode 11. The first circuit 1 is, for example, a portion of the circuit provided on the substrate 5. In such a case, the conductive body 50 is provided on the substrate 5 so that the circuit is positioned between the substrate 5 and the conductive body 50. Thus, the conductive body 50 shields the circuit in the substrate 5 from electromagnetic waves traveling toward the substrate 5 from outside the substrate 5 and the conductive body 50. As a result, the conductive body 50 may stabilize the circuit operation.

The insulating portion 28 is provided along the X-Y plane around the metal layers 62 and 66. The insulating portion 29 is provided on the insulating portion 28.

One of the first circuit 1 and the second circuit 2 is used as a transmitting circuit. The other of the first circuit 1 and the second circuit 2 is used as a receiving circuit. In the description herein, the first circuit 1 is a transmitting circuit, and the second circuit 2 is a receiving circuit.

The first circuit 1 transmits a signal (i.e., a current) to the first electrode 11. The current has a waveform suited to the transmission. When the current flows through the first electrode 11, a magnetic field is generated which passes through the first electrode 11 with the spiral shape. The first electrode 11 includes at least a portion arranged in the Z-direction with at least a portion of the second electrode 12. The magnetic force lines are generated so that a portion thereof passes through the second electrode 12. In the second electrode 12, an electromotive force is induced by the change of the magnetic field passing through the second electrode 12, and makes a current flow through the second electrode 12. The second circuit 2 detects the current flowing through the second electrode 12 and generates the signal that corresponds to the detection result. Thereby, the signal is transmitted from the first circuit 1 to the second circuit 2 while the current flow is blocked (insulated) between the first electrode 11 and the second electrode 12.

Examples of the materials of the components of the isolator 100 will now be described.

The first electrode 11, the second electrode 12, and the conductive body 50 include, for example, metals. The first electrode 11, the second electrode 12, and the conductive body 50 include, for example, at least one metal selected from the group consisting of copper and aluminum. It is preferable for the first electrode 11 and the second electrode 12 to have low electrical resistances to suppress the heat generation when transmitting the signal. In view of reducing the electrical resistance, it is preferable for the first electrode 11 and the second electrode 12 to include copper.

The insulating portion 20, the first insulating portion 21, the second insulating portion 22, and the insulating portion 28 include silicon and oxygen. For example, the insulating portion 20, the first insulating portion 21, the second insulating portion 22, and the insulating portion 28 include silicon oxide. The insulating portion 20, the first insulating portion 21, the second insulating portion 22, and the insulating portion 28 may further include nitrogen.

The insulating portion 29 includes an insulating resin of polyimide, polyamide, etc.

The dielectric portions 41 and 42 include silicon and nitrogen. For example, the dielectric portions 41 and 42 include silicon nitride.

The substrate 5 includes silicon and an impurity. The impurity is at least one selected from the group consisting of boron, phosphorus, arsenic, and antimony.

The dielectric portion 31 includes at least one selected from the group consisting of a first material including silicon and nitrogen, a second material including aluminum and oxygen, a third material including tantalum and oxygen, a fourth material including hafnium and oxygen, a fifth material including zirconium and oxygen, a sixth material including strontium, titanium and oxygen, a seventh material including bismuth, iron and oxygen, and an eighth material including barium, titanium and oxygen.

In the dielectric portion 31, the first dielectric layer 31p includes, for example, silicon nitride. The second dielectric layer 31q includes, for example, silicon oxide. The third dielectric layer 31r includes, for example, silicon nitride. The material of the third dielectric layer 31r may be different from the material of the first dielectric layer 31p.

For example, the first dielectric layer 31p and the third dielectric layer 31r include silicon and nitrogen, and the first insulating portion 21 and the second insulating portion 22 include silicon, oxygen, and nitrogen. In such a case, the nitrogen concentrations of the first dielectric layer 31p and the third dielectric layer 31r are greater than the nitrogen concentration of the first insulating portion 21 and greater than the nitrogen concentration of the second insulating portion 22.

The second electrode 12 may include a first metal layer 12a and a second metal layer 12b. The second metal layer 12b is provided between the first metal layer 12a and the first insulating portion 21, between the first metal layer 12a and the dielectric portion 31, and between the first metal layer 12a and the second insulating portion 22. The first electrode 11 may include a third metal layer 11c and a fourth metal layer 11d. The fourth metal layer 11d is provided between the third metal layer 11c and the insulating portion 20. The first metal layer 12a and the third metal layer 11c include copper. The second metal layer 12b and the fourth metal layer 11d include tantalum. The second metal layer 12b and the fourth metal layer 11d may include stacked films of tantalum and tantalum nitride. By providing the second metal layer 12b and the fourth metal layer 11d, the metal materials included in the first metal layer 12a and the third metal layer 11c can be prevented from diffusing into the insulating portions.

The first conductive portion 51 may include metal layers 51a and 51b. The metal layer 51b is provided between the metal layer 51a and the insulating portion 20. The second conductive portion 52 may include metal layers 52a and 52b. The metal layer 52b is provided between the metal layer 52a and the first insulating portion 21 and between the metal layer 52a and the first conductive portion 51. The third conductive portion 53 may include metal layers 53a and 53b. The metal layer 53b is provided between the metal layer 53a and the second insulating portion 22, between the metal layer 53a and the dielectric portion 31, and between the metal layer 53a and the second conductive portion 52. The metal layers 51a, 52a and 53a each include copper. The metal layers 51b, 52b and 53b each include tantalum. The metal layers 51b to 53b may include stacked films of tantalum and tantalum nitride. By providing the metal layers 51b to 53b, the metal materials included in the metal layers 51a to 53a can be prevented from diffusing into the insulating portions.

Figure 3:
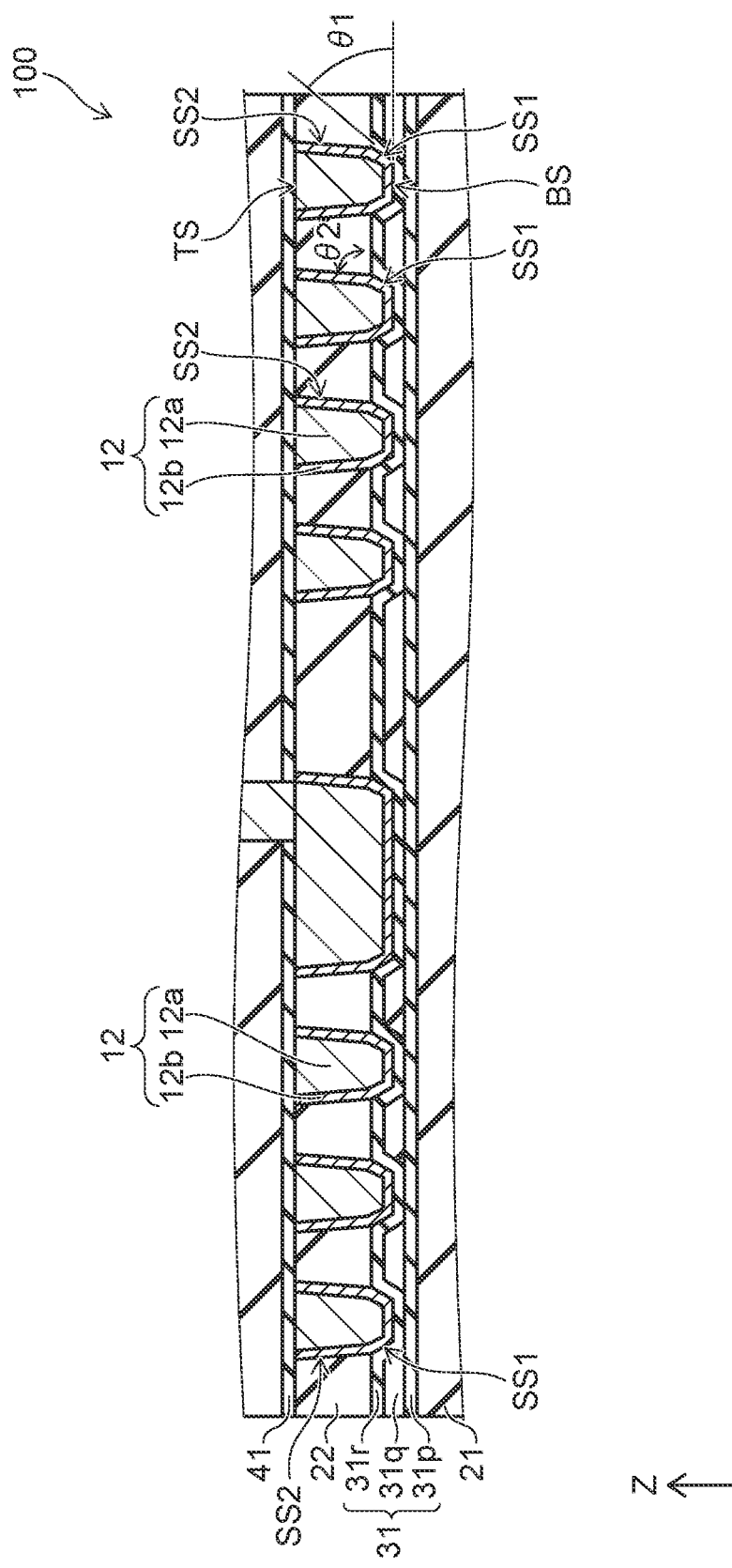
FIG. 3 is a cross-sectional view of an enlarged portion of FIG. 2.

FIG. 3 is a cross-sectional view of an enlarged portion of FIG. 2.

As illustrated in FIG. 3, the second electrode 12 is provided between the dielectric portion 31 and the dielectric portion 41. The dielectric portion 31 includes the first dielectric layer 31p, the second dielectric layer 31q, and the third dielectric layer 31r.

The second dielectric layer 31q is provided between the first dielectric layer 31p and the third dielectric layer 31r. The first dielectric layer 31p is provided between the first insulating portion 21 and the second dielectric layer 31q. The third dielectric layer 31r is provided between the second dielectric layer 31q and the second insulating portion 22.

The second dielectric layer 31q also is provided at a portion where the second electrode 12 is not provided. The first dielectric layer 31p and the third dielectric layer 31r each include a portion provided between the second electrode 12 and the first insulating portion 21.

For example, the second electrode 12 has a two-step tapered configuration in a cross section along the X-Z plane passing through the center of the spiral. In other words, the second electrode 12 has the beveled corner that connects the bottom facing the first insulating portion 21 and the side surface.

For example, the second electrode 12 has a bottom surface BS contacting the dielectric portion 31 and an upper surface TS contacting the dielectric portion 41. The bottom surface BS has the width in the X-direction is less than the width in the X-direction of the top surface TS. The second electrode 12 also includes a first side surface SS1 and a second side surface SS2. The first side surface SS1 is connected to the bottom surface BS and the second side surface SS2. The second side surface SS2 is connected to the first side surface SS1 and the top surface TS. The first side surface SS1 is tilted upward with respect to the bottom surface BS. The first side surface SS1 has a tilt angle $\theta 1$ with respect to the bottom surface BS, and the second side surface SS2 has a tilt angle $\theta 2$ with respect to the bottom surface BS. The tilt angle $\theta 1$ is less than the tilt angle $\theta 2$. The bottom surface BS and the first side surface SS1 of the second electrode 12 contact the third dielectric layer 31r. The second side surface SS2 contacts the second insulating portion 22.

FIGS. 4A to 6B are cross-sectional views illustrating a method for manufacturing the isolator according to the first embodiment. One example of the method for manufacturing the isolator according to the first embodiment will be described with reference to FIGS. 4A to 6B.

FIGS. 4A to 6B illustrate manufacturing processes at the position shown by line A1-A2 in FIG. 1. In the cross-sectional views hereinbelow, the wiring 61 that connects the conductive body 50 and the first electrode 11 is omitted to clearly illustrate the outer edge of the first electrode 11.

Figure 4A:
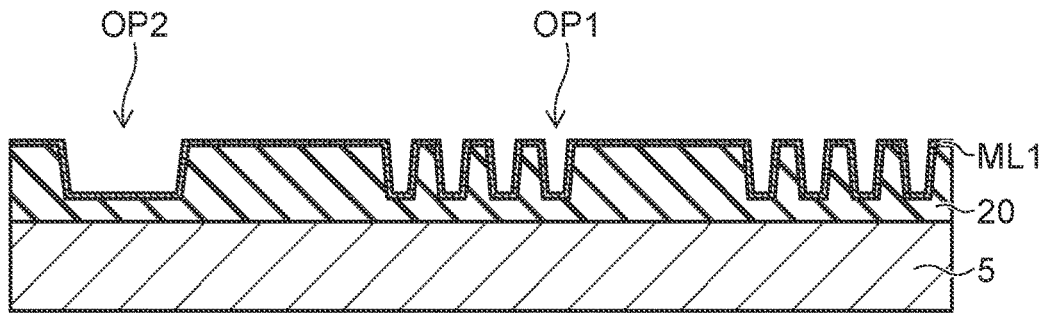
FIGS. 4A to 6B are cross-sectional views illustrating a method for manufacturing the isolator according to the first embodiment.

The insulating portion 20 is formed on the substrate 5 by chemical vapor deposition (CVD). Openings OP1 and OP2 are formed in the upper surface of the insulating portion 20 by reactive ion etching (RIE). The opening OP1 is formed at a position corresponding to the first electrode 11. The opening OP2 is formed at a position corresponding to the first conductive portion 51. As illustrated in FIG. 4A, a metal layer ML1 is formed by sputtering along the upper surface of the insulating portion 20 in which the openings OP1 and OP2 are formed.

Figure 4B:
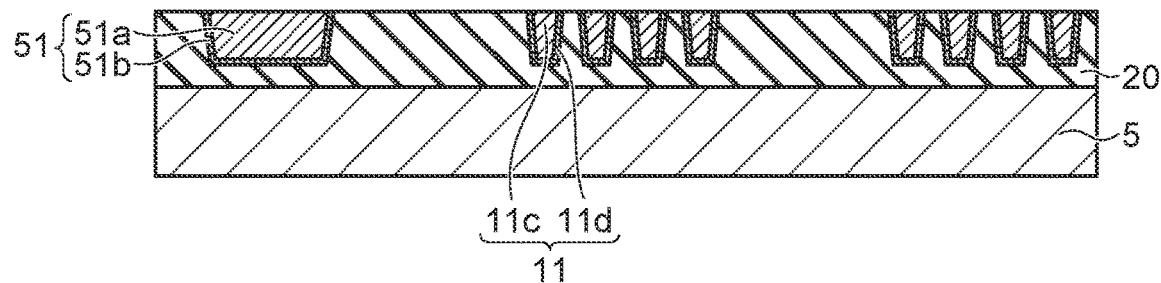

Other metal layer is formed on the metal layer ML1 so that the openings OP1 and OP2 are filled therewith. The other metal layer is formed by sputtering a seed layer on the metal layer ML1 and plating a plating layer on the seed layer. Continuing, chemical mechanical polishing (CMP) is performed until the upper surface of the insulating portion 20 is exposed. As illustrated in FIG. 4B, the first electrode 11 and the first conductive portion 51 are formed, which include the metal layer ML1 and the other metal layer.

Figure 4C:
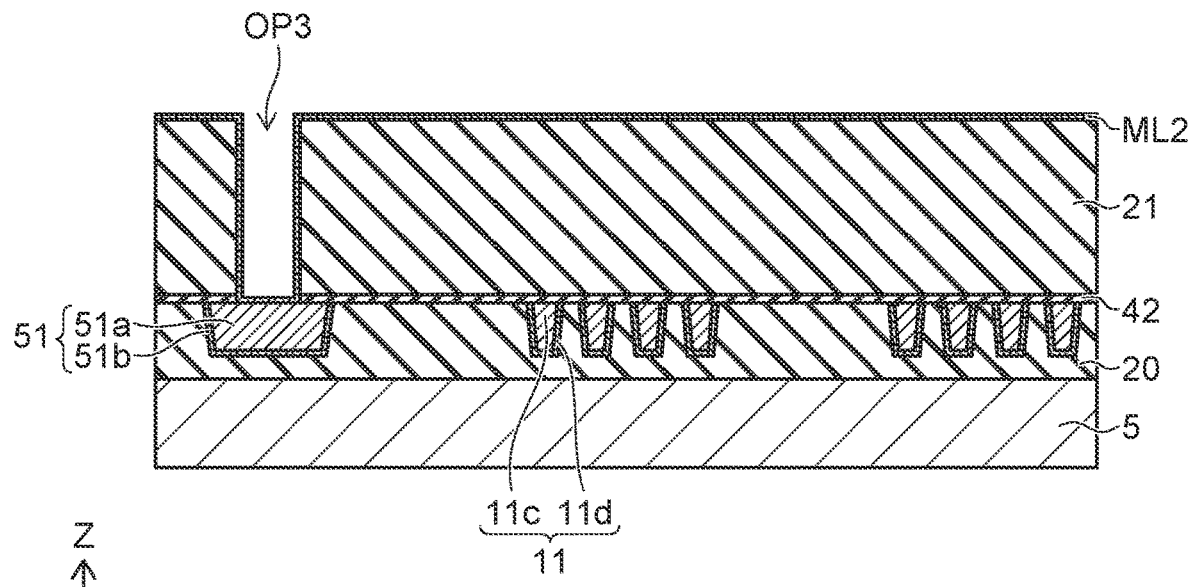

The dielectric portion 42 is formed by CVD on the first electrode 11 and the first conductive portion 51. The first insulating portion 21 is formed by CVD on the dielectric portion 42. An opening OP3 that extends through the first insulating portion 21 and the dielectric portion 42 and reaches the first conductive portion 51 is formed by RIE. As illustrated in FIG. 4C, a metal layer ML2 is formed by sputtering. The metal layer ML2 is formed along the upper surface of the first insulating portion 21 and the inner surface of the opening OP3.

Figure 5A:
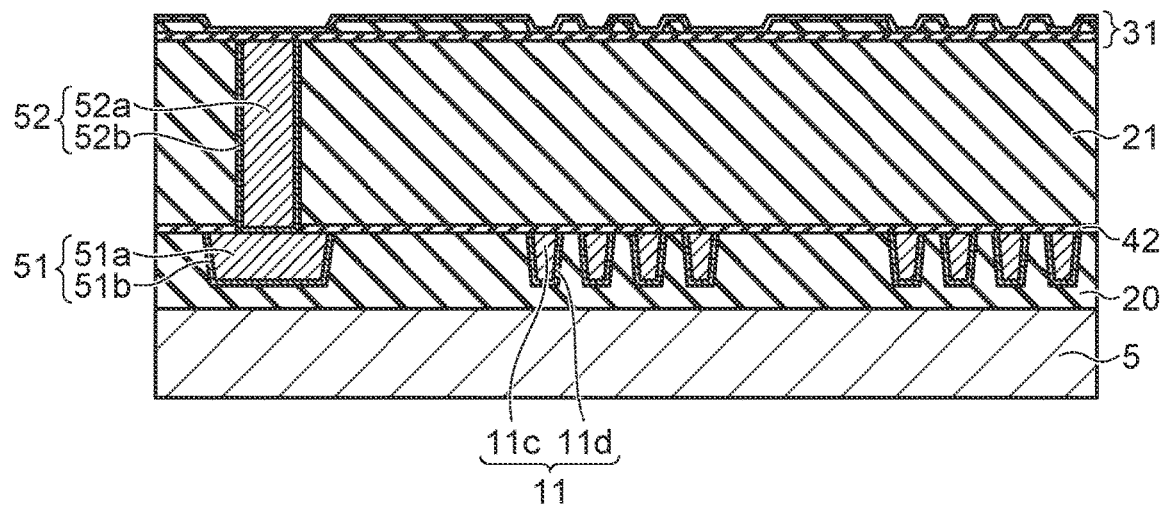

Other metal layer is formed on the metal layer ML2 by sputtering and plating. The opening OP3 is filled with the metal layer ML2 and the other metal layer. CMP is performed until the upper surface of the first insulating portion 21 is exposed. The second conductive portion 52 is formed thereby. As illustrated in FIG. 5A, a dielectric portion DL1 is formed on the first insulating portion 21 and the second conductive portion 52. Details of the method for forming the dielectric portion DL1 are described below.

Figure 5B:
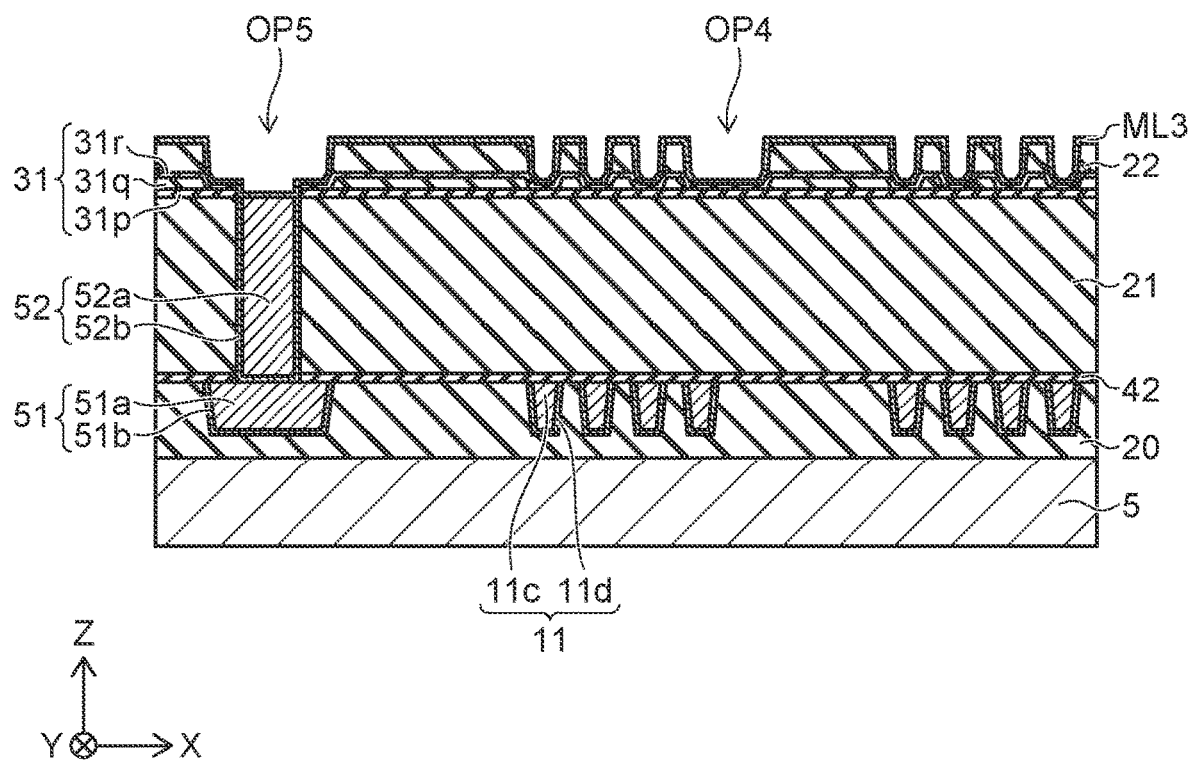

The second insulating portion 22 is formed by CVD on the dielectric portion DL1. Openings OP4 and OP5 that extend through the second insulating portion 22 are formed by RIE. The opening OP4 is formed at a position corresponding to the second electrode 12 and is positioned above the first electrode 11. The opening OP5 is formed at a position corresponding to the third conductive portion 53 and is positioned on the second conductive portion 52. The second conductive portion 52 is exposed at the bottom of the opening OP5 by selectively removing the dielectric portion DL1. As illustrated in FIG. 5B, a metal layer ML3 is formed by sputtering. The metal layer ML3 is formed along the inner surface of the opening OP4, the inner surface of the opening OP5, and the upper surface of the second insulating portion 22.

Figure 6A:
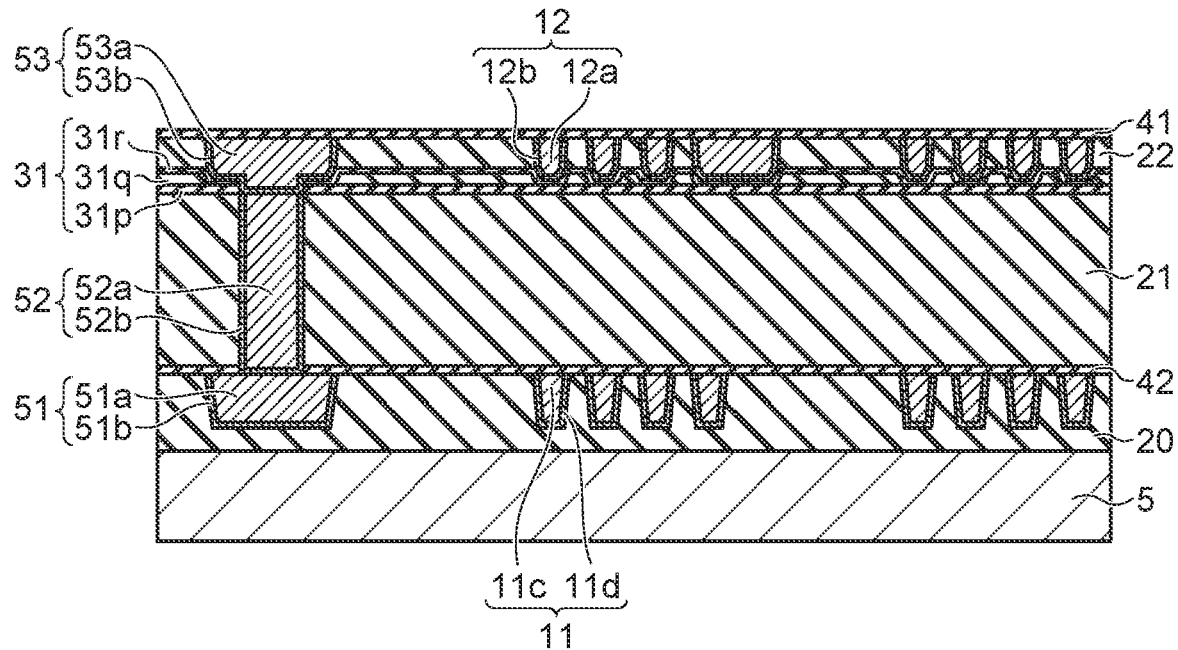

A metal layer ML4 (see FIG. 9B) is formed on the metal layer ML3 by plating. The openings OP4 and OP5 are filled with the metal layer ML3 and the metal layer ML4. Continuing, CMP is performed until the upper surface of the second insulating portion 22 is exposed. The second electrode 12 and the third conductive portion 53 are formed thereby, which include the metal layer ML3 and the metal layer ML4. The dielectric portion DL1 corresponds to the dielectric portion 31. As illustrated in FIG. 6A, the dielectric portion 41 is formed by CVD on the second electrode 12 and the third conductive portion 53.

Figure 6B:
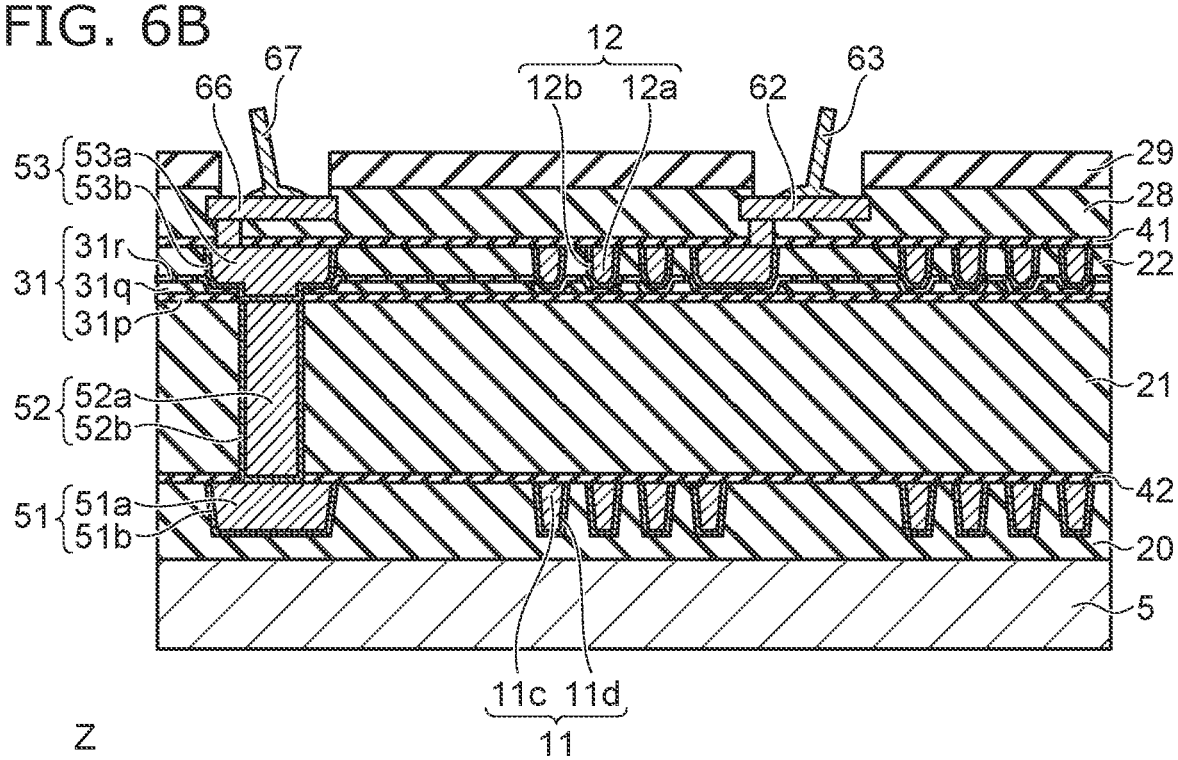

As illustrated in FIG. 6B, the isolator 100 is completed by forming the metal layer 62, the metal layer 64 (referring to FIG. 1), the metal layer 66, the insulating portion 28 and the insulating portion 29 on the dielectric portion 41. The metal layer 62 and 64 are electrically connected to the second electrode 12. The metal layer 66 is electrically connected to the third conductive portion 53. The insulating portion 28 includes a first insulating layer and a second insulating layer. The first insulating layer covers the dielectric portion 41. The first insulating layer includes a portion positioned between the dielectric portion 41 and each of the metal layers 62, 64, and 66. The second insulating layer is provided on the first insulating layer. Here, the boundary between the first and second insulating layers is not shown explicitly.

For example, the metal layers 62, 64, and 66 are formed after forming the first insulating layer on the dielectric portion 41. The metal layers 62 and 64 are electrically connected to the second electrode 12 via contact holes provided in the first insulating layer and the dielectric portion 41. The metal layer 66 is electrically connected to the third conductive portion 53. For example, the metal layers 62, 66, and 64 are formed by sputtering and then formed to have a prescribed thickness by using a selective plating method.

Subsequently, the second insulating layer and the insulating portion 29 are formed to cover the metal layers 62, 64 and 66; and then, openings positioned above the metal layers 62, 64 and 66 are formed in the insulating portion 29 by, for example, photolithography. Subsequently, the metal layers 62, 64 and 66 are exposed by selectively removing the second insulating layer via the openings of the insulating portion 29. The insulating portion 28 is, for example, a silicon oxide layer formed by CVD. The insulating portion 29 is, for example, a photosensitive resin such as polyimide, etc.

Finally, the wiring 63, the wiring 65 (referring to FIG. 1), and the wiring 67 are connected respectively to the metal layers 62, 64, and 66.

FIGS. 7A to 9C are schematic cross-sectional views illustrating a method for manufacturing the coil (i.e., the second electrode 12) according to the first embodiment. FIGS. 7A to 9C are schematic cross-sectional views illustrating the details of the manufacturing method described for FIGS. 5A to 6A.

Figure 7A:
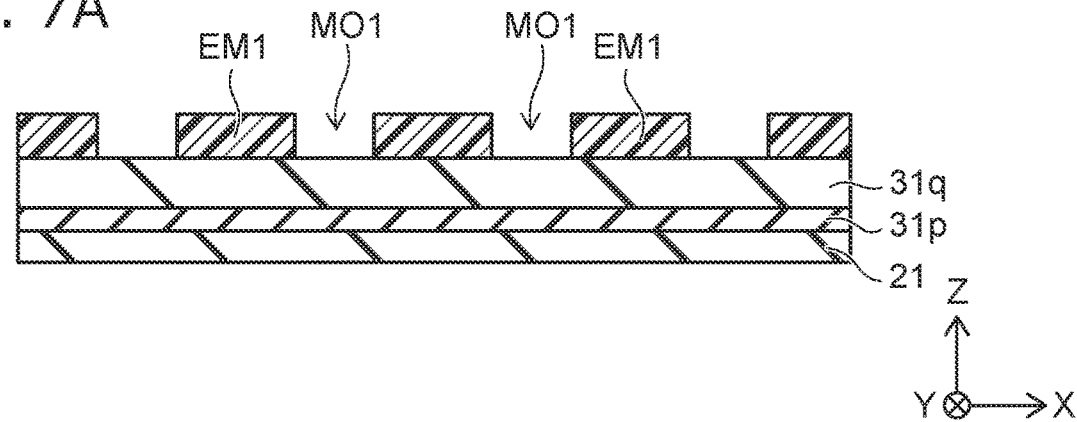
FIGS. 7A to 9C are schematic cross-sectional views illustrating a method for manufacturing a coil according to the first embodiment.

As shown in FIG. 7A, the first dielectric layer 31$p$ and the second dielectric layer 31$q$ are formed on the first insulating portion 21. For example, the first dielectric layer 31$p$ and the second dielectric layer 31$q$ are formed using CVD or sputtering.

An etching mask EM1 is formed on the second dielectric layer 31$q$. The etching mask EM1 is, for example, a resist layer patterned using photolithography. The etching mask EM1 has an opening MO1 corresponding to the region in which the second electrode 12 is formed.

Figure 7B:
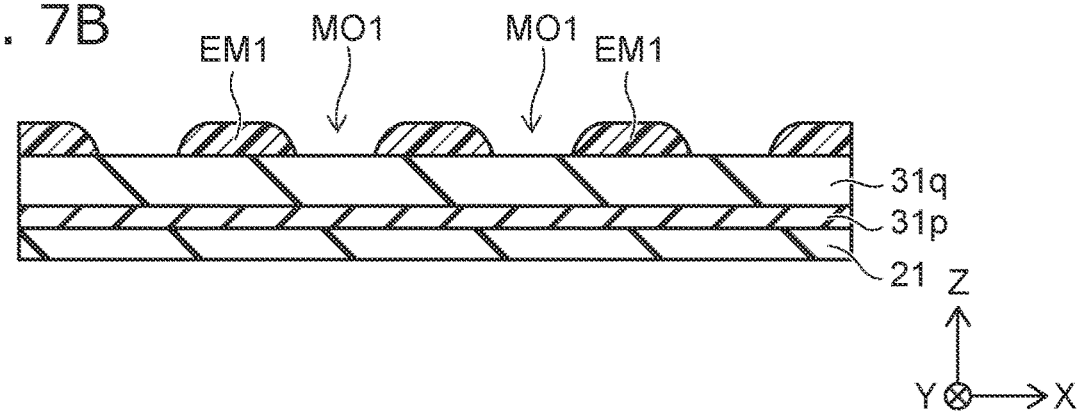

As shown in FIG. 7B, the etching mask EM1 is deformed so that the side surface that faces the opening MO1 is tilted. For example, the etching mask EM1 is subjected to the heat treatment at a temperature higher than the softening point of the etching mask EM1.

Figure 7C:
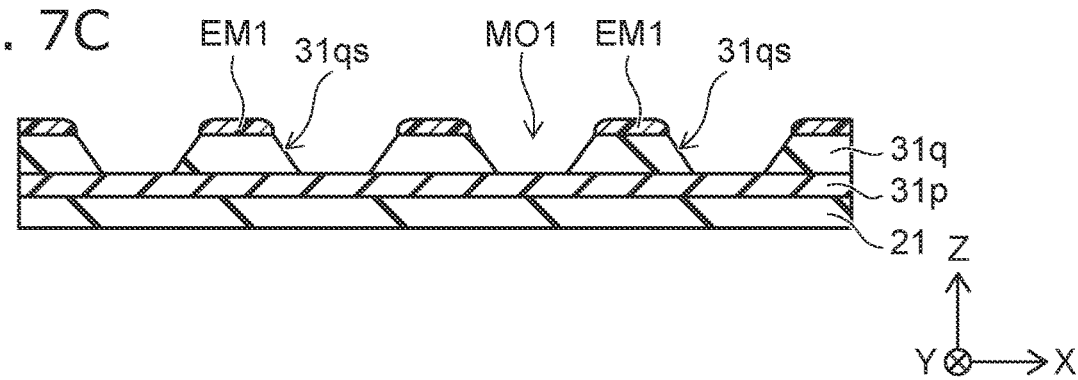

As shown in FIG. 7C, the configuration of the etching mask EM1 is transferred to the second dielectric layer 31q by etching the second dielectric layer 31q and the etching mask EM1. The second dielectric layer 31q and the etching mask EM1 are etched by, for example, dry etching. The second dielectric layer 31q is etched using, for example, the conditions under which the first dielectric layer 31p acts as an etching stopper. The second dielectric layer 31q is etched so that a side surface 31qs that faces the opening MO1 is tilted.

Figure 7D:
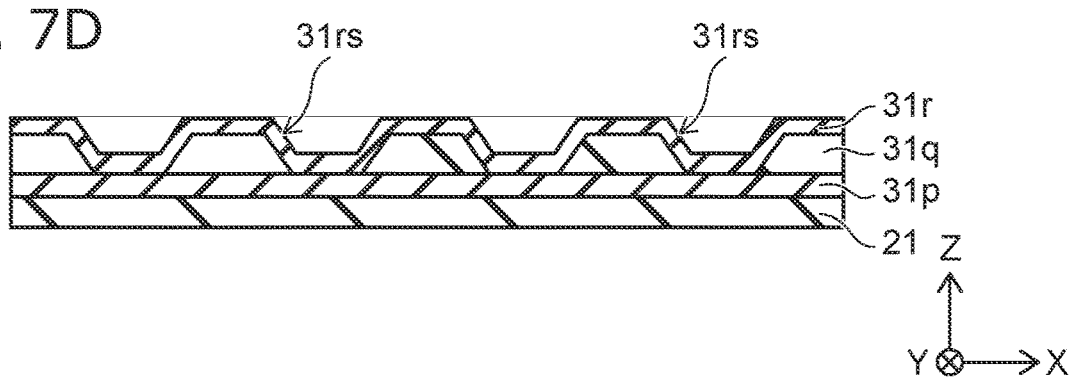

As shown in FIG. 7D, after removing the etching mask EM1, the third dielectric layer 31r is formed to cover the first dielectric layer 31p and the second dielectric layer 31q. For example, the third dielectric layer 31r is formed using CVD.

The third dielectric layer 31r is formed to have a recess at a position corresponding to the opening MO1. The third dielectric layer 31r includes an oblique surface 31rs corresponding to the side surface 31qs of the second dielectric layer 31q. The first dielectric layer 31p, the second dielectric layer 31q, and the third dielectric layer 31r are included in the dielectric portion DL1 shown in FIG. 5A.

Figure 8A:
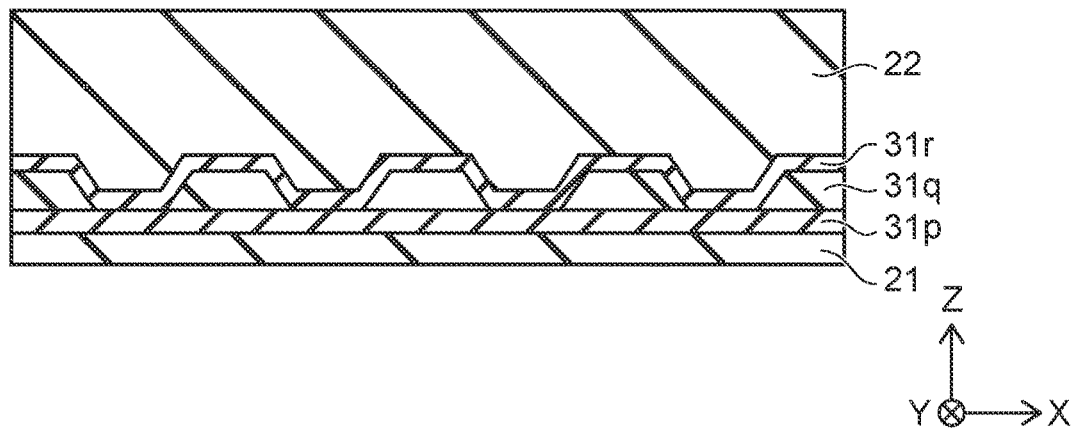

As shown in FIG. 8A, the second insulating portion 22 is formed on the third dielectric layer 31r. The second insulating portion 22 is formed so that the upper surface of the second insulating portion 22 is flat by filling the recess of the dielectric portion DL1. The thickness in the Z-direction of the second insulating portion 22 is substantially equal to the thickness in the Z-direction of the second electrode 12.

Figure 8B:
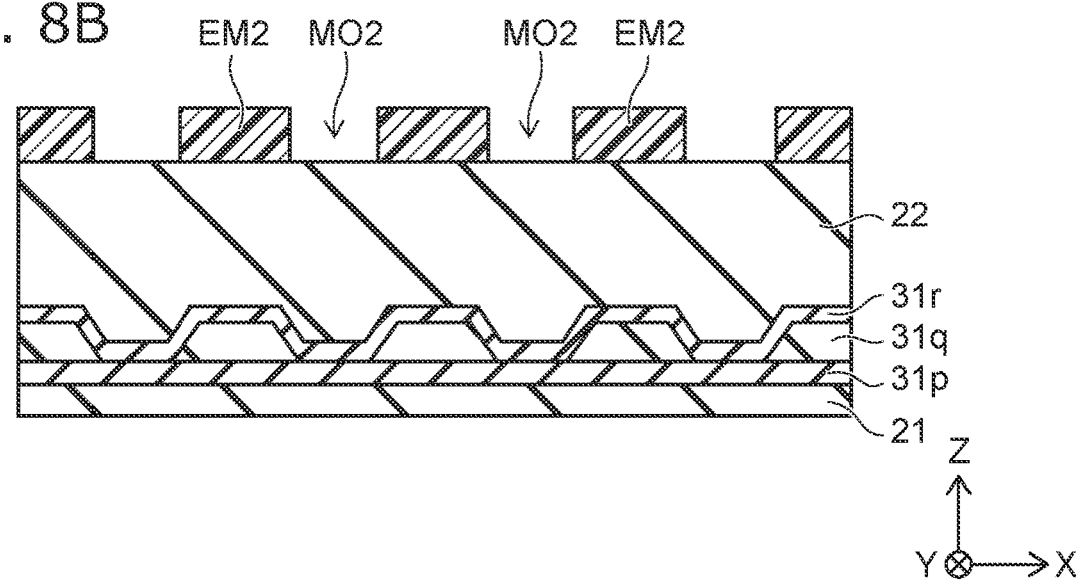

As shown in FIG. 8B, an etching mask EM2 is formed on the second insulating portion 22. The etching mask EM2 is, for example, a resist layer patterned using photolithography. The etching mask EM2 has an opening MO2 on the region of the second insulating portion 22 in which the second electrode 12 is formed.

Figure 8C:
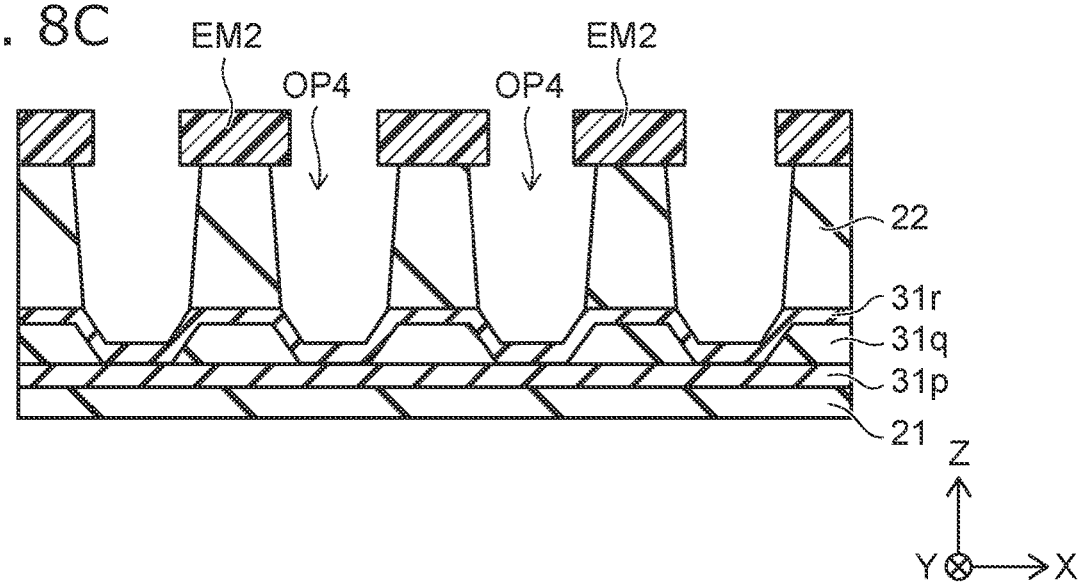

As shown in FIG. 8C, the etching mask EM2 is used to form the opening OP4 in the second insulating portion 22 by selectively removing the second insulating portion 22. For example, the second insulating portion 22 is removed using dry etching. For example, the second insulating portion 22 is etched using the conditions under which the third dielectric layer 31r acts as an etching stopper.

Figure 9A:
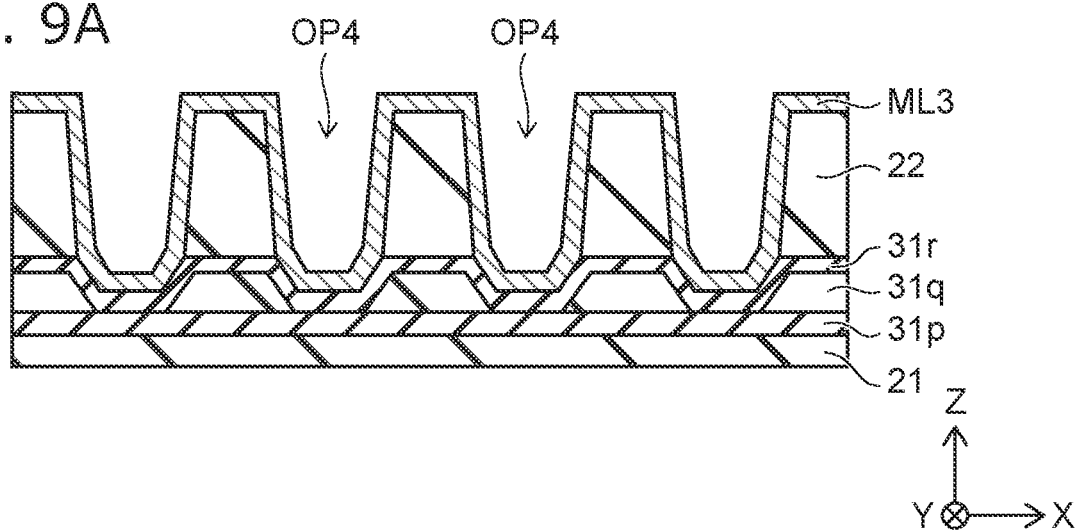

As shown in FIG. 9A, the metal layer ML3 is formed along the inner surface of the opening OP4 and the upper surface of the second insulating portion 22 in which the opening OP4 is formed (referring to FIG. 5B). The metal layer ML3 is formed to cover the inner surface of the opening OP4.

Figure 9B:
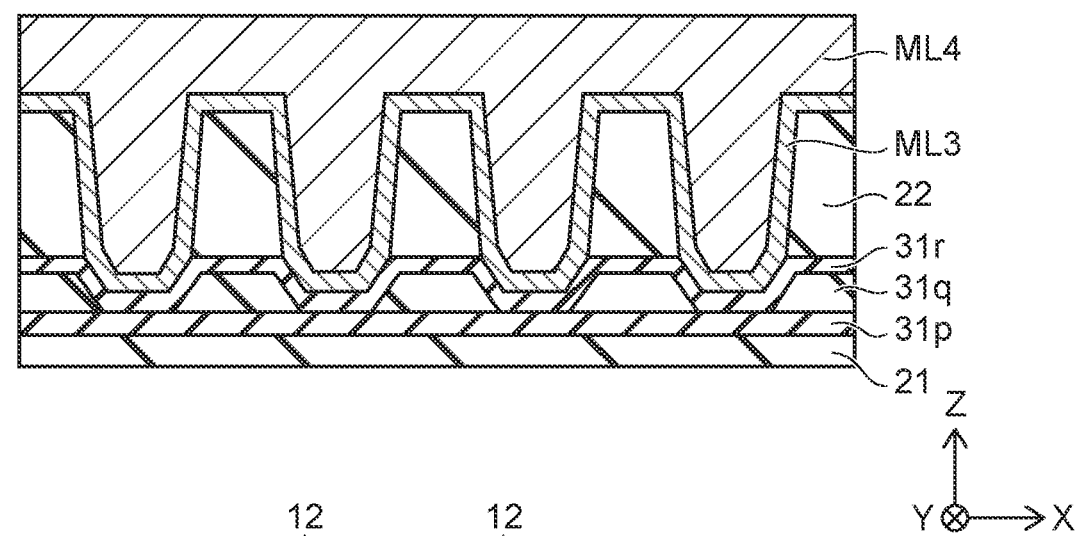

As shown in FIG. 9B, the metal layer ML4 is formed on the metal layer ML3 by, for example, sputtering and plating. The metal layer ML4 is formed so that the opening OP4 is filled therewith.

Figure 9C:
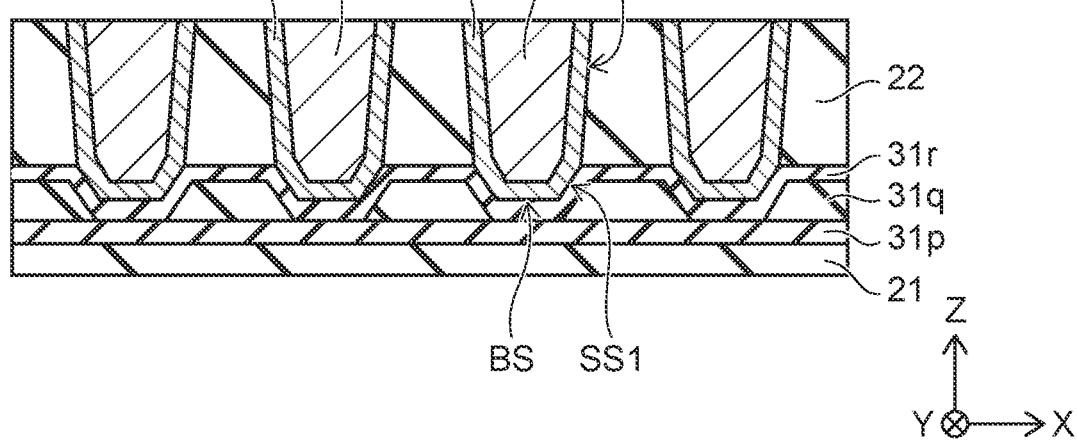

As shown in FIG. 9C, CMP is performed until the upper surface of the second insulating portion 22 is exposed. The metal layer ML4 and the metal layer ML3 are removed so that portions thereof remain in the opening OP4. Thereby, the second electrode 12 is formed, which includes the metal layer ML3 and the metal layer ML4 (referring to FIG. 6A).

The metal layer ML4 includes a portion that serves as the first metal layer 12a of the second electrode 12. The metal layer ML3 includes a portion that serves as the second metal layer 12b. The second electrode 12 is formed so that the bottom surface BS contacts the third dielectric layer 31r. Also, the first side surface SS1 of the second electrode 12 faces the tilted side surface of the second dielectric layer 31q via the third dielectric layer 31r. The second side surface SS2 contacts the second insulating portion 22 exposed at the inner wall of the opening OP4.

FIGS. 10A to 10D are schematic cross-sectional views illustrating a method for manufacturing the coil (the second electrode 12) according to a modification of the first embodiment. FIGS. 10A to 10D illustrate a manufacturing method replacing the manufacturing method shown in FIGS. 7A to 7D.

Figure 10A:
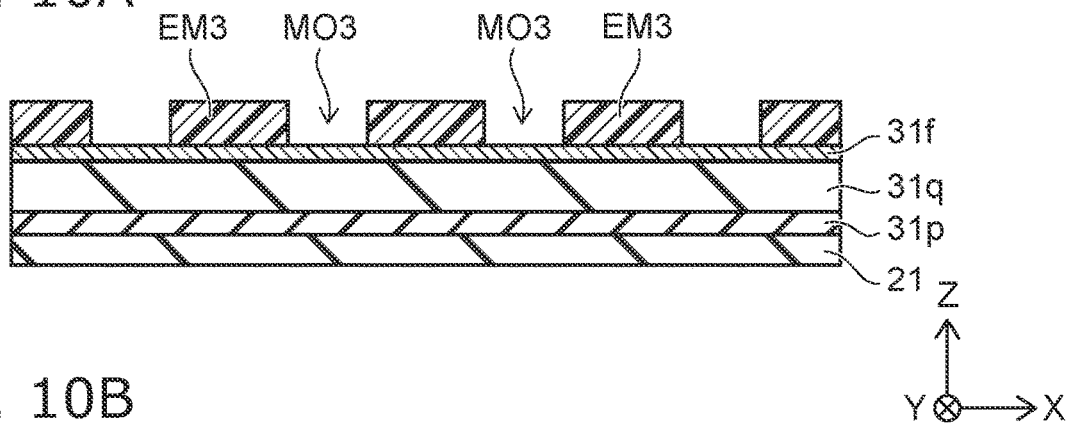
FIGS. 10A to 10D are schematic cross-sectional views illustrating a method for manufacturing a coil according to a modification of the first embodiment.

As shown in FIG. 10A, the first dielectric layer 31p, the second dielectric layer 31q, and a metal layer 31f are formed on the first insulating portion 21. For example, the first dielectric layer 31p and the second dielectric layer 31q are formed using CVD. The metal layer 31f is formed on the second dielectric layer 31q by, for example, sputtering. The metal layer 31f is, for example, a nickel layer.

An etching mask EM3 is formed on the metal layer 31f over the second dielectric layer 31q. The etching mask EM3 is, for example, a resist layer patterned using photolithography. The etching mask EM3 has an opening MO3 in the region in which the second electrode 12 is formed.

Figure 10B:
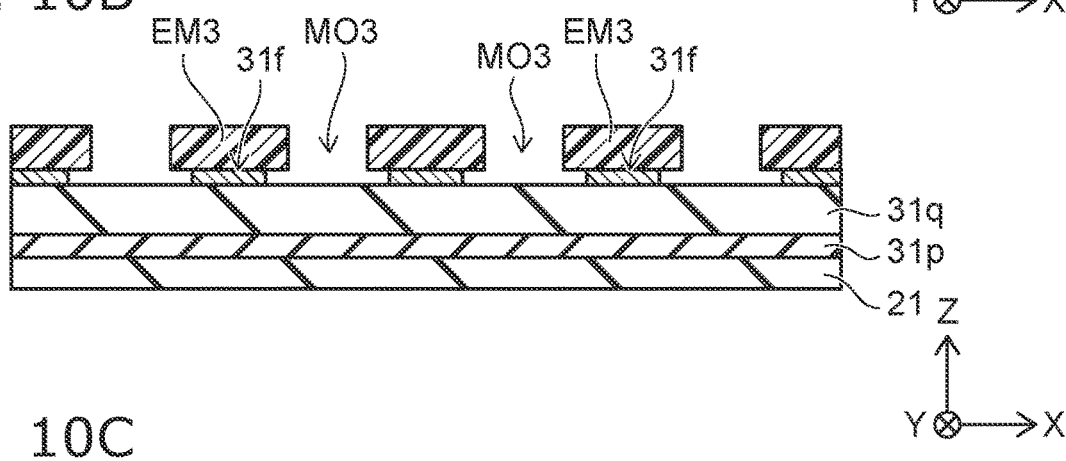

As shown in FIG. 10B, the metal layer 31f is selectively etched via the opening MO3. The metal layer 31f is etched to be recessed inward from the side surface of the etching mask EM3. In other words, the etching forms a space between the second dielectric layer 31q and the etching mask EM3 along the outer edge of the etching mask EM3.

Figure 10C:
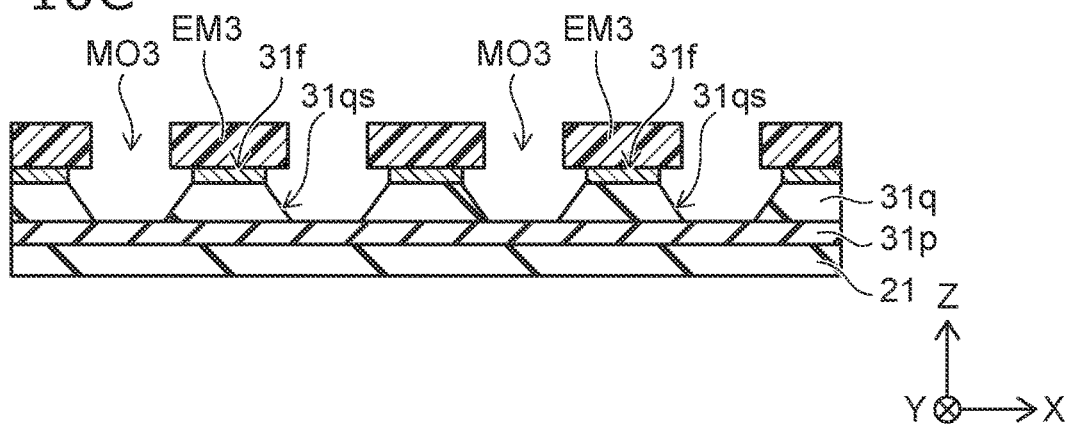

As shown in FIG. 10C, the second dielectric layer 31q is selectively etched using the etching mask EM3. For example, the second dielectric layer 31q is etched by wet etching under the conditions such that the first dielectric layer 31p acts as an etching stopper. At this time, the etching of the second dielectric layer 31q progresses in the lateral direction (e.g., the X-direction) because the metal layer 31f is recessed from the outer edge of the etching mask EM3. The side surface 31qs of the second dielectric layer 31q facing the opening MO3 is formed to be tilted thereby.

Figure 10D:
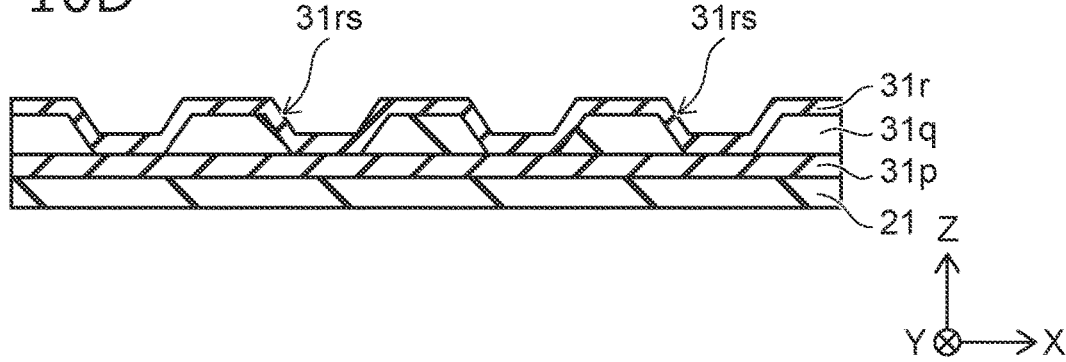

As shown in FIG. 10D, after removing the etching mask EM3 and the metal layer 31f, the third dielectric layer 31r is formed to cover the first dielectric layer 31p and the second dielectric layer 31q. The third dielectric layer 31r is formed to have a recess at a position corresponding to the opening MO3. The third dielectric layer 31r includes the oblique surface 31rs corresponding to the side surface 31qs of the second dielectric layer 31q. The first dielectric layer 31p, the second dielectric layer 31q, and the third dielectric layer 31r are included in the dielectric portion 31 shown in FIG. 5A.

Continuing, the second electrode 12 is formed inside the second insulating portion 22 through the processes shown in FIGS. 8A to 9C.

Figure 11A:
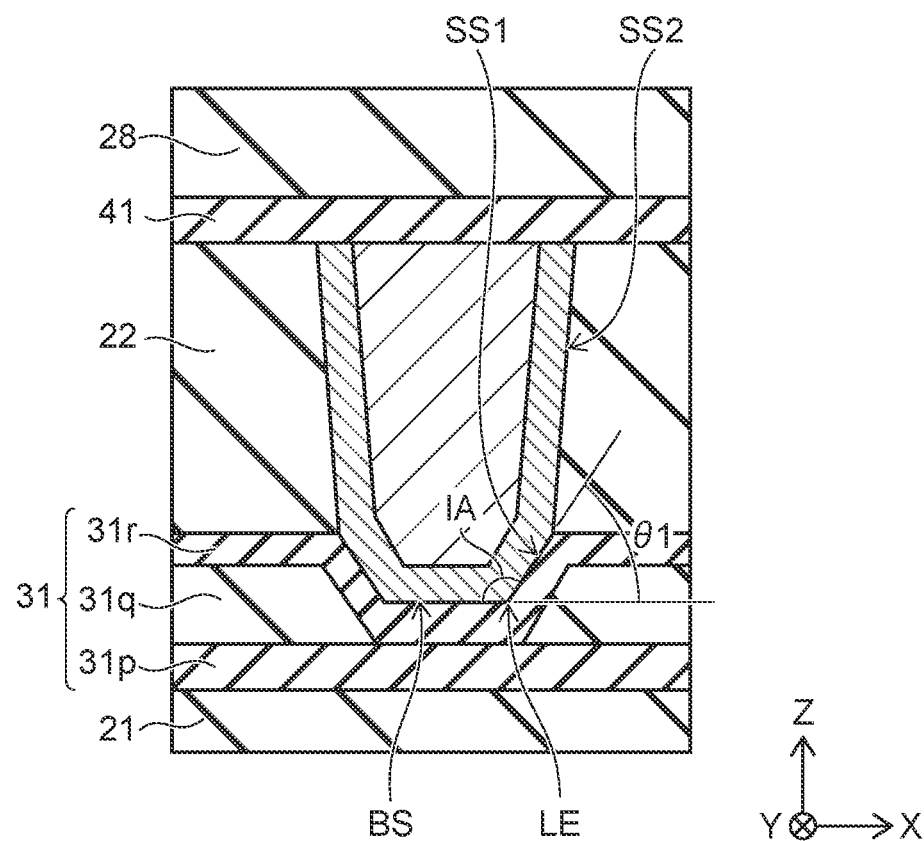
FIGS. 11A and 11B are schematic views showing a characteristic of the isolator according to the first embodiment.
Figure 11B:
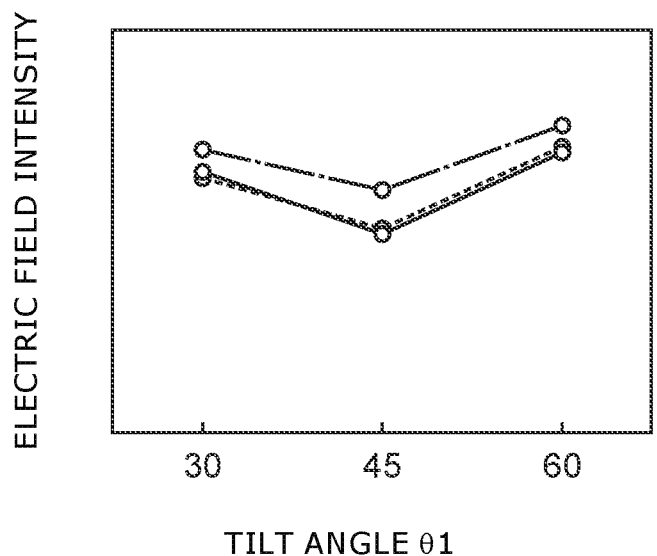

FIGS. 11A and 11B are schematic views showing a characteristic of the isolator 100 according to the first embodiment. FIG. 11A is a schematic cross-sectional view of the enlarged cross section of the second electrode 12 shown in FIG. 3. FIG. 11B is a schematic view showing the relationship at the second electrode 12 between the electric field intensity at a lower edge LE and the tilt angle θ1 of the first side surface SS1.

In the isolator 100, when a signal is transmitted between the first electrode 11 and the second electrode 12, a positive voltage with respect to the first electrode 11 is applied to the second electrode 12. Thereby, a potential difference is generated between the first electrode 11 and the second electrode 12 and between the conductive body 50 and the second electrode 12. At this time, electric field concentration occurs at the vicinity of the lower edge LE of the second electrode 12. When the electric field intensity at the vicinity of the lower edge LE is high, dielectric breakdown occurs, and the isolator 100 is broken. Thus, it is desirable for the electric field intensity at the vicinity of the lower edge LE to be low.

As shown in FIG. 11A, in the isolator 100, the second electrode 12 includes the first side surface SS1 and the second side surface SS2 which have different tilts with respect to the bottom surface BS. The first side surface SS1 is provided between the bottom surface BS and the second side surface SS2 and is connected to the bottom surface BS and the second side surface SS2. The tilt angle θ1 of the first side surface SS1 with respect to the bottom surface BS is less than the tilt angle θ2 of the second side surface SS2 with respect to the bottom surface BS (referring to FIG. 3). Therefore, an interior angle IA between the bottom surface BS and the first side surface SS1 is large, compared with the case where the second side surface SS2 is directly connected to the bottom surface BS. That is, the interior angle IA at the lower edge LE of the second electrode 12 is greater than the case without the first side surface SS1. The electric field concentration at the lower edge LE of the second electrode 12 can be relaxed thereby.

The inventors calculated the electric field intensity at the vicinity of the lower edge LE of the second electrode 12 by simulation. The result of the simulation is shown in FIG. 11B. The vertical axis of FIG. 11B is the electric field intensity at the lower edge LE. The horizontal axis is the tilt angle θ1 of the first side surface SS1 with respect to the bottom surface BS.

As shown in FIG. 11B, the electric field intensity at the lower edge LE has a minimum when the tilt angle θ1 is 45 degrees. The electric field intensity increases as the tilt angle θ1 increases from 45 degrees. Also, the electric field intensity increases as the tilt angle θ1 decreases from 45 degrees.

According to the first embodiment, the edge of the second electrode 12 facing the first insulating portion 21 is formed to have a beveled shape that provides the first side surface SS1. Thereby, it is possible to reduce the likelihood of dielectric breakdown caused by a leakage current by relaxing the electric field concentration at the vicinity of the lower edge LE.

By the method for manufacturing the isolator 100 according to the embodiment, the first side surface SS1 can be formed stably with an increased reproducibility. For example, the edge of the second electrode 12 facing the first insulating portion 21 can be rounded without the dielectric portion DL1 in the case where the second insulating portion 22 is selectively removed by wet etching. It is also possible to relax the electric field concentration at the lower edge of the second electrode 12 in this manner. However, the shape control of the second electrode 12 may have poor reproducibility when the wet etching is used only, and make it difficult to obtain stable characteristics.

In the embodiment, it is easy for the metal layer ML3 to cover the inner surface of the opening OP4 without leaving gaps (referring to FIG. 9A) because the second electrode 12 includes the first side surface SS1 and the second side surface SS2. Thereby, the metal layer ML3 can be thin, and can be prevented from cracking and like. Also, the unfilled defects such as voids, etc., can be suppressed when filling the opening OP4 with the metal layer ML4 (referring to FIG. 9B).

Figure 12:
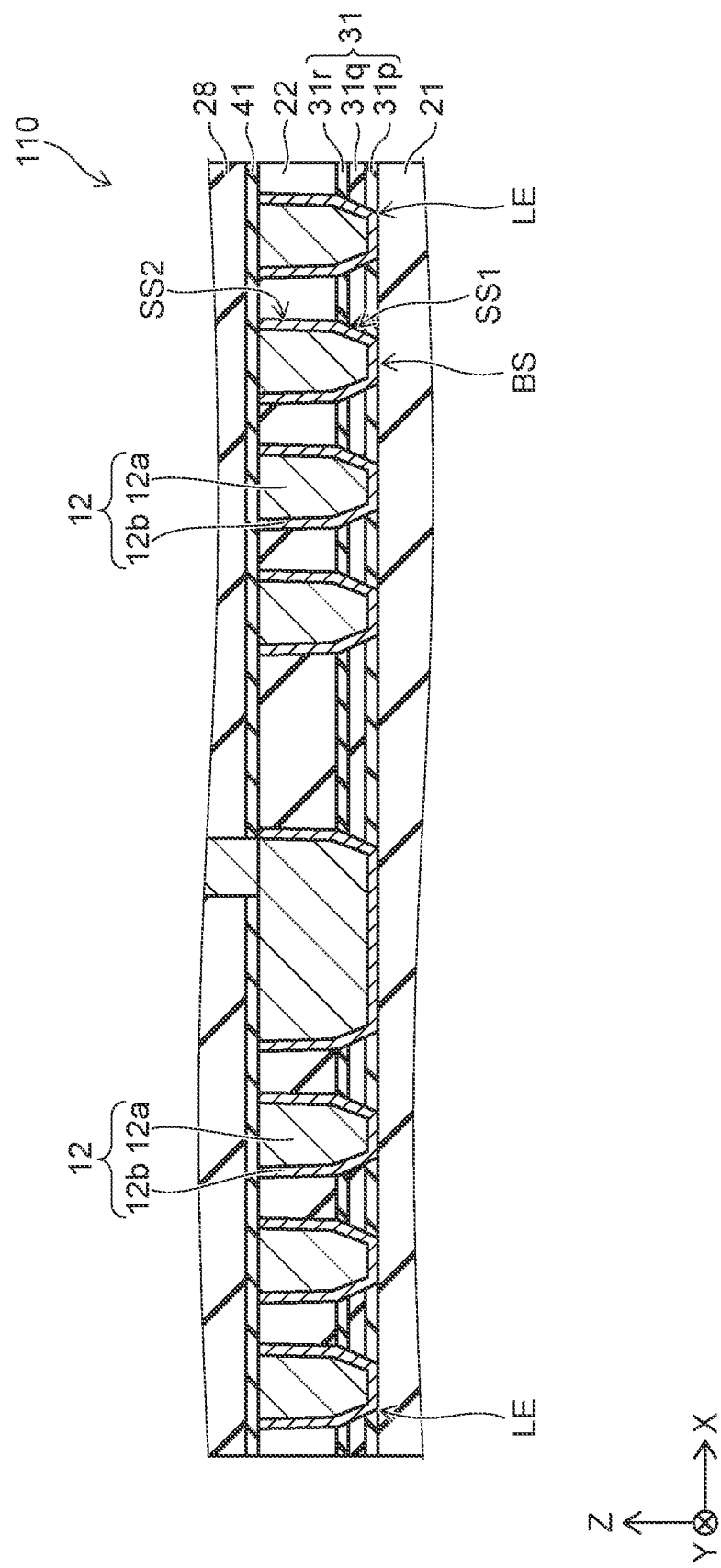
FIGS. 12 to 14 are schematic cross-sectional views illustrating isolators according to modifications of the first embodiment.
Figure 13:
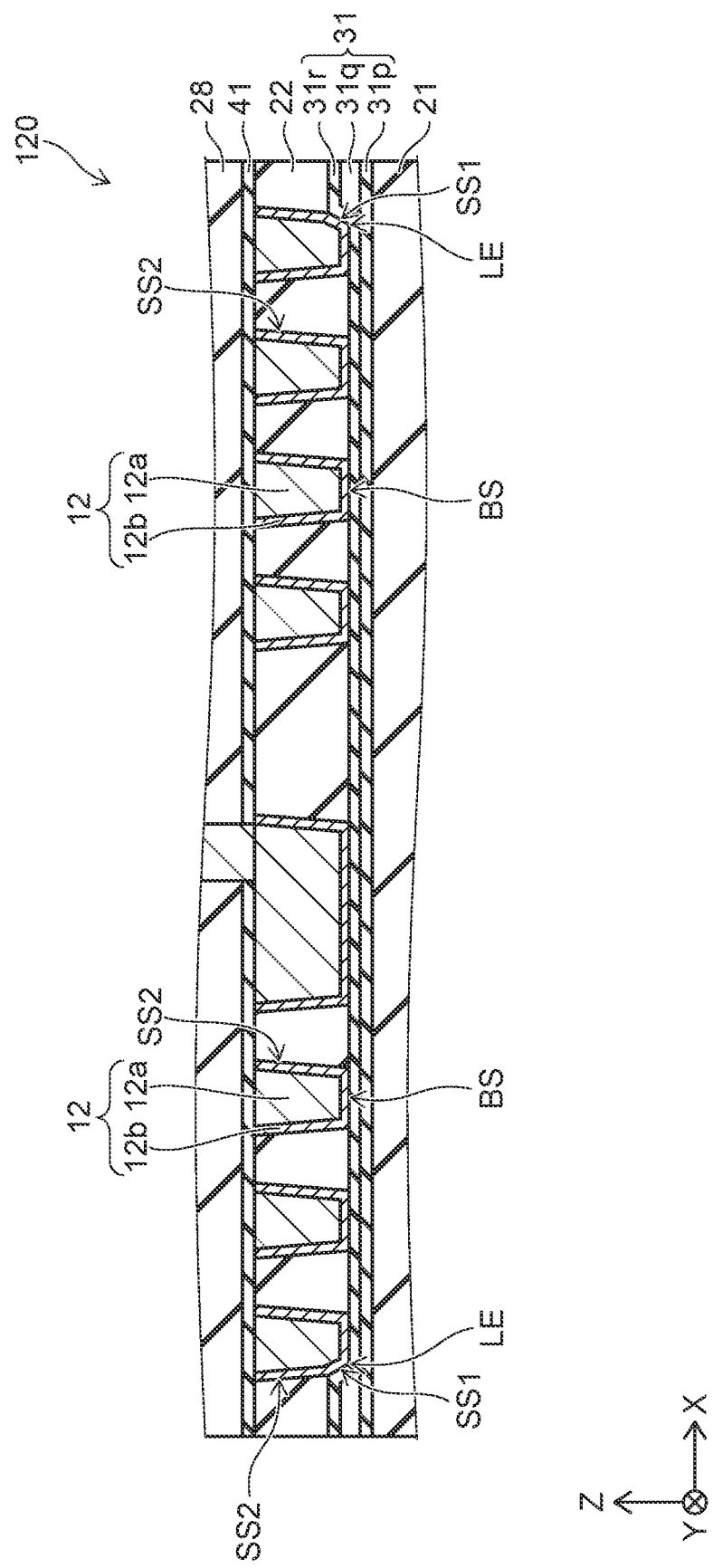
Figure 14:
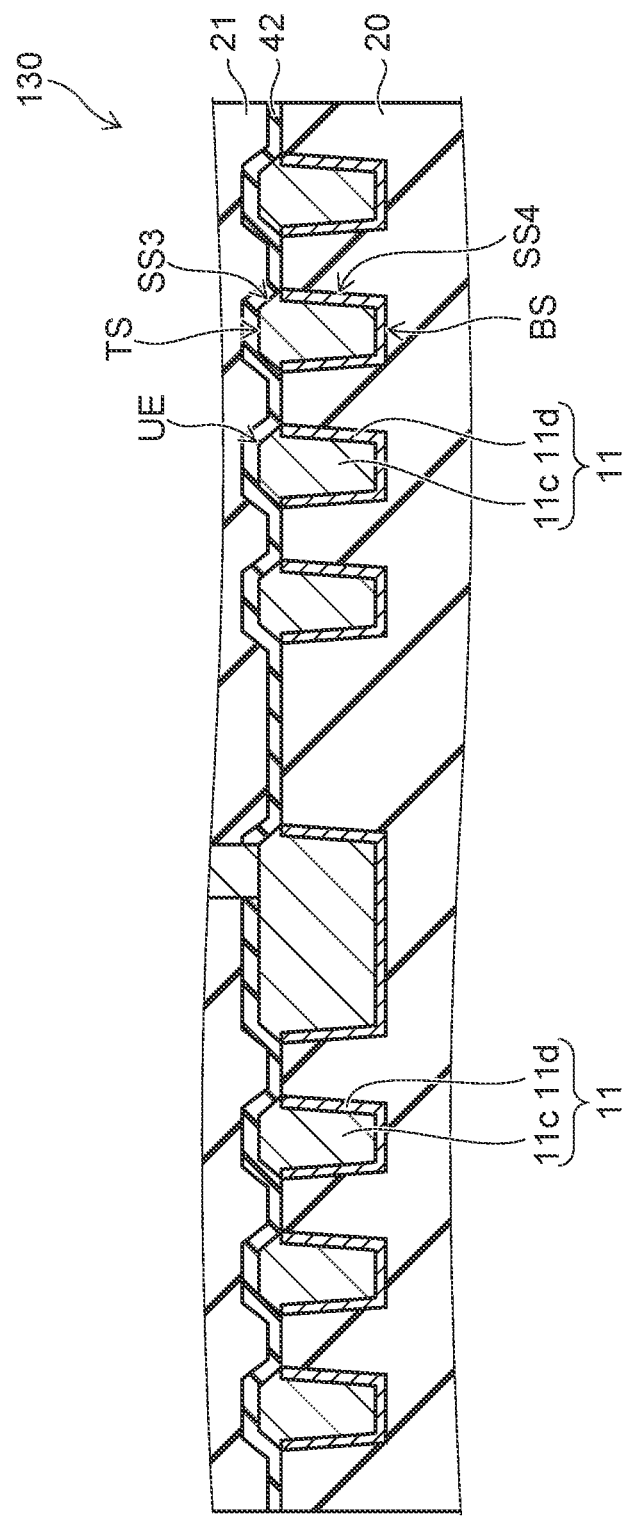

FIGS. 12 to 14 are schematic cross-sectional views respectively illustrating isolators 110, 120, and 130 according to modifications of the first embodiment.

In the isolator 110 shown in FIG. 12, the second electrode 12 is provided so that the bottom surface BS contacts the first insulating portion 21. The first side surface SS1 contacts the first dielectric layer 31p and the second dielectric layer 31q. The third dielectric layer 31r is positioned at a level in the Z-direction at which the first side surface SS1 and the second side surface SS2 are connected.

The isolator 110 is formed through the process shown in FIG. 8C by making the first insulating portion 21 being exposed. For example, the third dielectric layer 31r and the first dielectric layer 31p are etched in order, which are exposed at the bottom of the opening OP4. At this time, the first dielectric layer 31p and the third dielectric layer 31r are etched under the conditions such that the etching rates of the first dielectric layer 31p, the second dielectric layer 31q, and the third dielectric layer 31r are substantially the same.

In the isolator 110, the second electrode 12 also includes the first side surface SS1 and the second side surface SS2, and thereby, the electric field concentration can be relaxed at the lower edge LE of the second electrode 12.

In the isolator 120 shown in FIG. 13, the second electrode 12 includes the first side surface SS1 and the second side surface SS2 at the outermost perimeter of the second electrode 12 which is provided in a spiral configuration along the X-Y plane. The second electrode 12 includes a portion positioned inward of the outermost perimeter, in which the second side surface SS2 is directly connected to the bottom surface BS. Also, in the portion of the second electrode 12 positioned inward of the outermost perimeter, the second dielectric layer 31q is not provided between the second insulating portion 22 and the first insulating portion 21; and the first dielectric layer 31p is in contact with the third dielectric layer 31r.

For example, the electric field concentration is induced at the lower edge LE of the portion positioned at the outermost perimeter by the potential difference between the first electrode 11 and the second electrode 12. In the example, the electric field concentration can be relaxed, and the breakdown immunity can be increased by providing the first side surface SS1 at the portion positioned at the outermost perimeter.

FIG. 14 is a schematic view showing a cross section of the first electrode 11 of the isolator 130. In the example, the upper end of the first electrode 11 facing the first insulating portion 21 has a beveled edge. The first electrode 11 includes a third side surface SS3 and a fourth side surface SS4.

The first electrode 11 further includes the upper surface TS and the bottom surface BS. The third side surface SS3 is positioned between the upper surface TS and the fourth side surface SS4. The third side surface SS3 is connected to the upper surface TS and the fourth side surface SS4. The fourth side surface SS4 is positioned between the third side surface SS3 and the bottom surface BS. The fourth side surface SS4 is connected to the third side surface SS3 and the bottom surface BS.

The third side surface SS3 is tilted downward with respect to the upper surface TS. The electric field concentration at an upper edge UE of the first electrode 11 can be relaxed thereby.

Figure 15A:
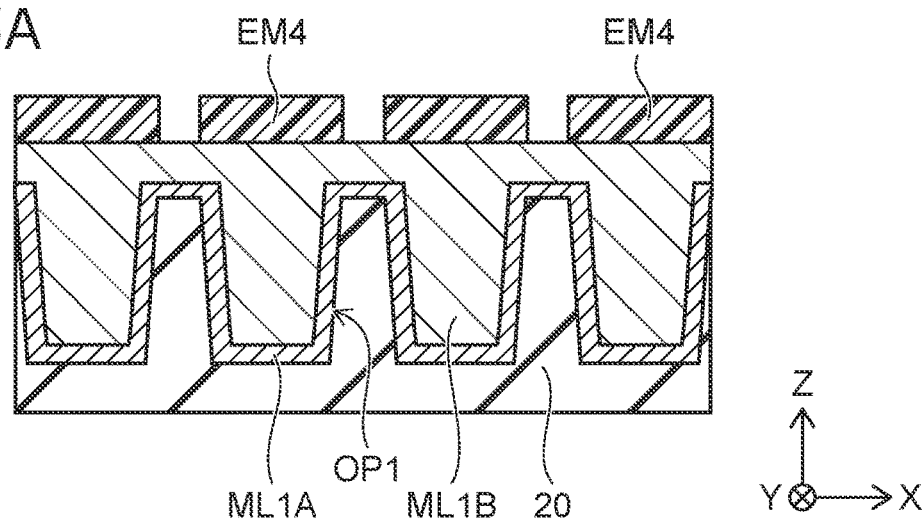
FIGS. 15A to 15C are schematic cross-sectional views illustrating a method for manufacturing a coil according to a modification of the embodiment.
Figure 15B:
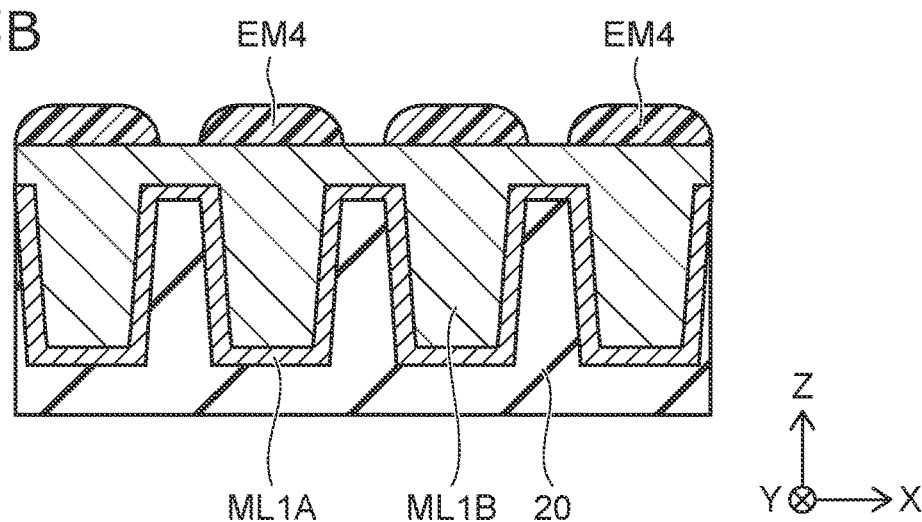
Figure 15C:
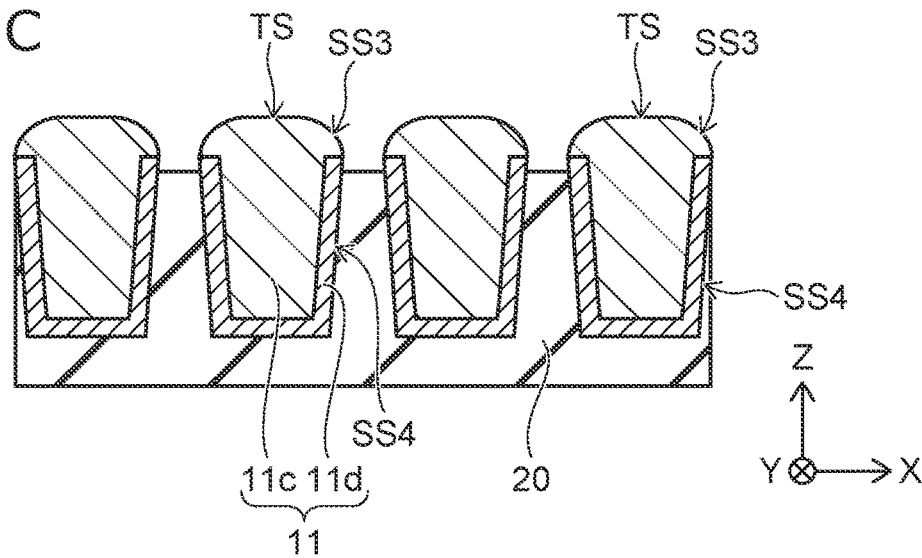

FIGS. 15A to 15C are schematic cross-sectional views illustrating a method for manufacturing the coil (i.e., the first electrode 11) according to a modification of the embodiment. The manufacturing processes illustrated in FIGS. 15A to 15C correspond to the process shown in FIG. 4B.

As shown in FIG. 15A, the surface of the insulating portion 20 including the inner surface of the opening OP1 is covered with a metal layer ML1A (referring to FIG. 4A); and a metal layer ML1B is provided so that the opening OP1 is filled therewith. An etching mask EM4 is provided at the upper surface of the metal layer ML1B.

The etching mask EM4 is, for example, a resist layer patterned using photolithography. The etching mask EM4 is formed to cover the portion of the metal layer ML1B that is embedded in the opening OP1.

As shown in FIG. 15B, the etching mask EM4 is deformed by heat treatment. For example, the etching mask EM4 is subjected to the heat treatment at a temperature higher than the softening point of the etching mask EM4. Thereby, the etching mask EM4 is deformed so that the side surface thereof is tilted.

As shown in FIG. 15C, the configuration of the etching mask EM4 is transferred onto the portions of the metal layer ML1B and the metal layer ML1A that is embedded in the opening OP1 by etching the metal layer ML1B, the metal layer ML1A and the etching mask EM4. For example, the metal layers ML1A and ML1B and the etching mask EM4 are etched by dry etching or ion milling under the conditions such that the etching rates thereof are substantially the same. The third side surface SS3 can be formed thereby, which is tilted downward with respect to the upper surface TS.

For example, the first electrode 11 shown in FIG. 14 can be combined with the second electrodes 12 shown in FIGS. 3, 12 and 13. Thereby, the breakdown immunities can be improved further in the isolators 100, 110, and 120.

Second Embodiment

Figure 16:
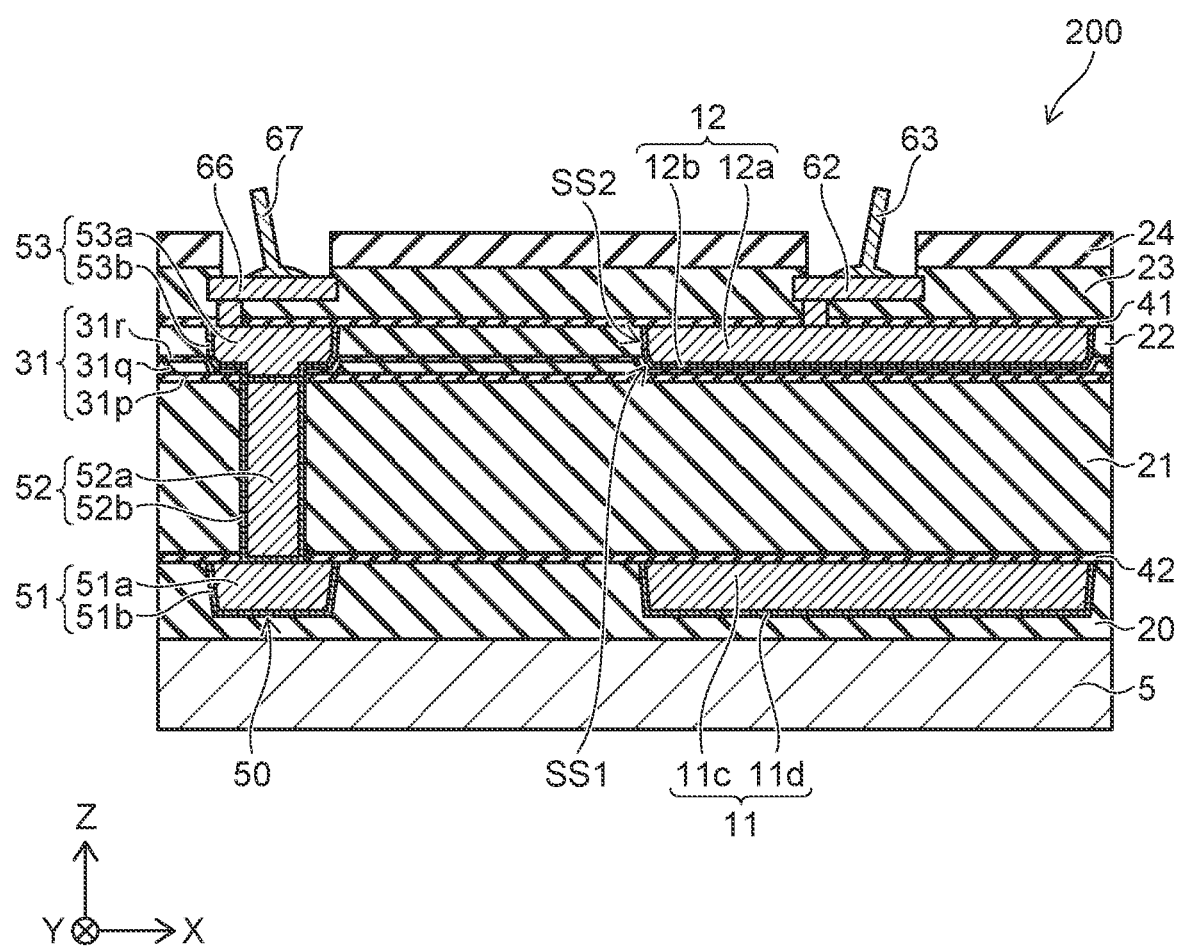
FIG. 16 is a schematic cross-sectional view showing an isolator according to a second embodiment.

FIG. 16 is a schematic cross-sectional view showing an isolator 200 according to a second embodiment. In the isolator 200, the first electrode 11 and the second electrode 12 are provided in flat plate configurations facing each other when the isolator 200 is viewed along the Z-direction. The first electrode 11 and the second electrode 12 may be, for example, circular, elliptical, or polygonal. The first electrode 11 and the second electrode 12 are provided so that the upper surface of the first electrode 11 and the lower surface of the second electrode 12 are, for example, parallel to each other.

The isolator 200 transmits a signal utilizing the change of an electric field instead of the change of magnetic field. Specifically, when the second circuit 2 applies a voltage to the second electrode 12, an electric field is induced between the first electrode 11 and the second electrode 12. The first circuit 1 detects the electrode-electrode capacitance at this time and generates a signal based on the detection result. Thereby, the signal is transmitted between the first electrode 11 and the second electrode 12, whereas an electric current is blocked therebetween.

In the example, the second electrode 12 also includes the first side surface SS1 and the second side surface SS2. Thereby, the electric field intensity can be reduced at the vicinity of the lower edge LE, and it is possible to reduce the likelihood of breakdown that occurs in the isolator when applying the voltage to the second electrode 12.

Third Embodiment

Figure 17:
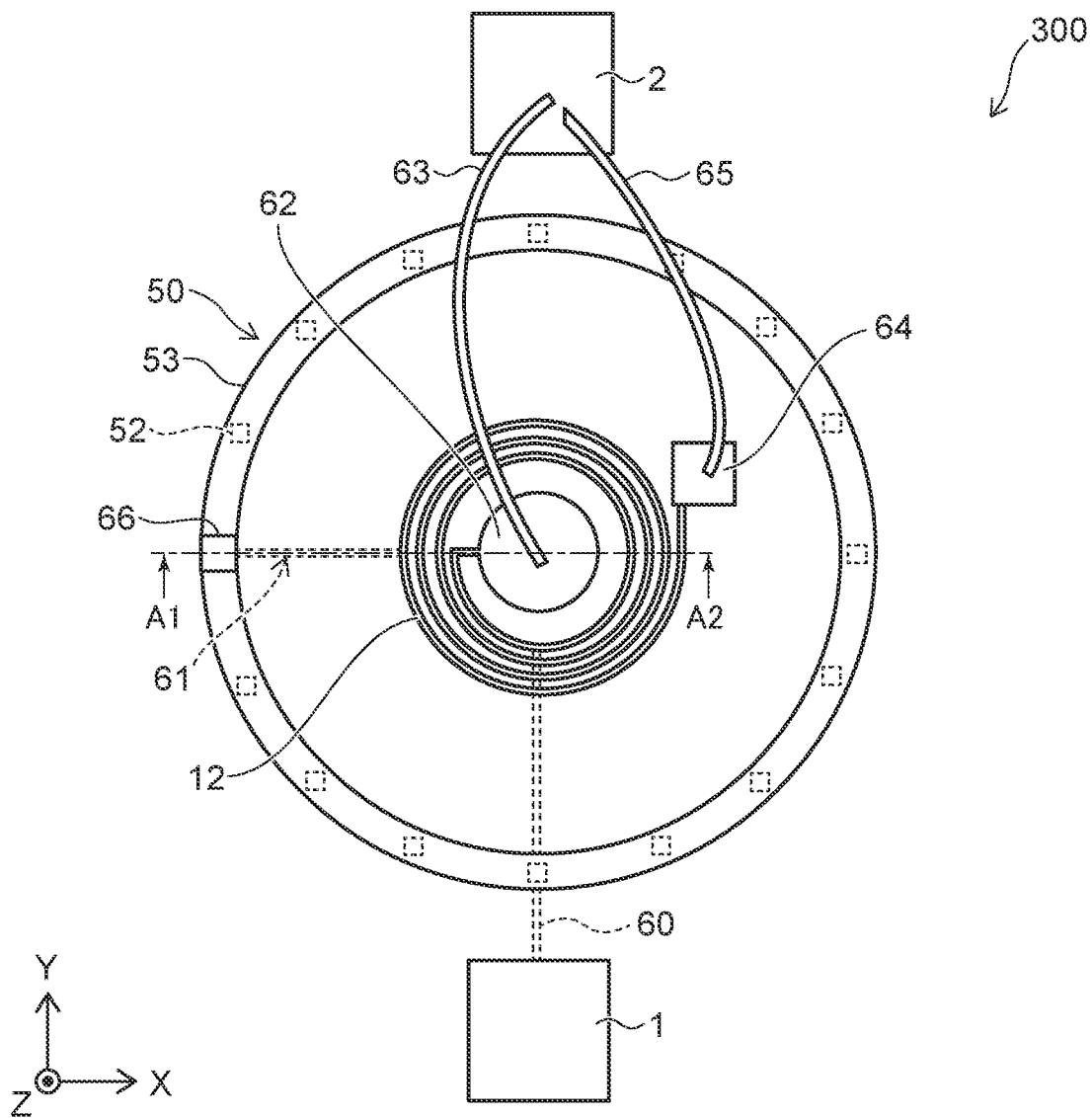
FIG. 17 is a plan view illustrating an isolator according to a third embodiment.

FIG. 17 is a plan view illustrating an isolator 300 according to a third embodiment.

Figure 18:
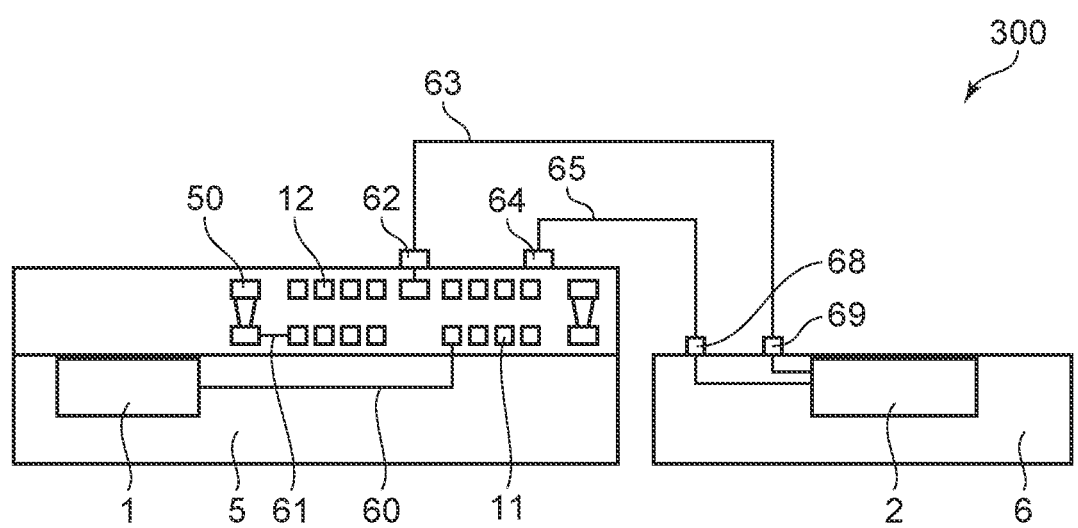
FIG. 18 is a schematic view illustrating the cross-sectional structure of the isolator according to the third embodiment.

FIG. 18 is a schematic view illustrating the cross-sectional structure of the isolator 300 according to the third embodiment.

In the isolator 300 according to the third embodiment, the first electrode 11 has one end at the outer perimeter portion that is electrically connected to the conductive body 50 via the wiring 61 as illustrated in FIG. 17. The other end of the first electrode 11 is electrically connected to the first circuit 1 via the wiring 60.

As illustrated in FIG. 18, the first circuit 1 is provided inside the substrate 5. The second circuit 2 is provided inside a substrate 6 that is separated from the substrate 5. The metal layer 62 is electrically connected via the wiring 63 to a metal layer 69 provided on the substrate 6. The metal layer 64 is electrically connected via the wiring 65 to a metal layer 68 provided on the substrate 6. The second circuit 2 is electrically connected to the metal layers 68 and 69.

According to the embodiments, the structures described above are applicable to the structure of the isolator 300 provided above the substrate 5. The electric field intensity can be reduced thereby in the vicinity of the lower edge at the end surface of the second electrode 12.

Figure 19:
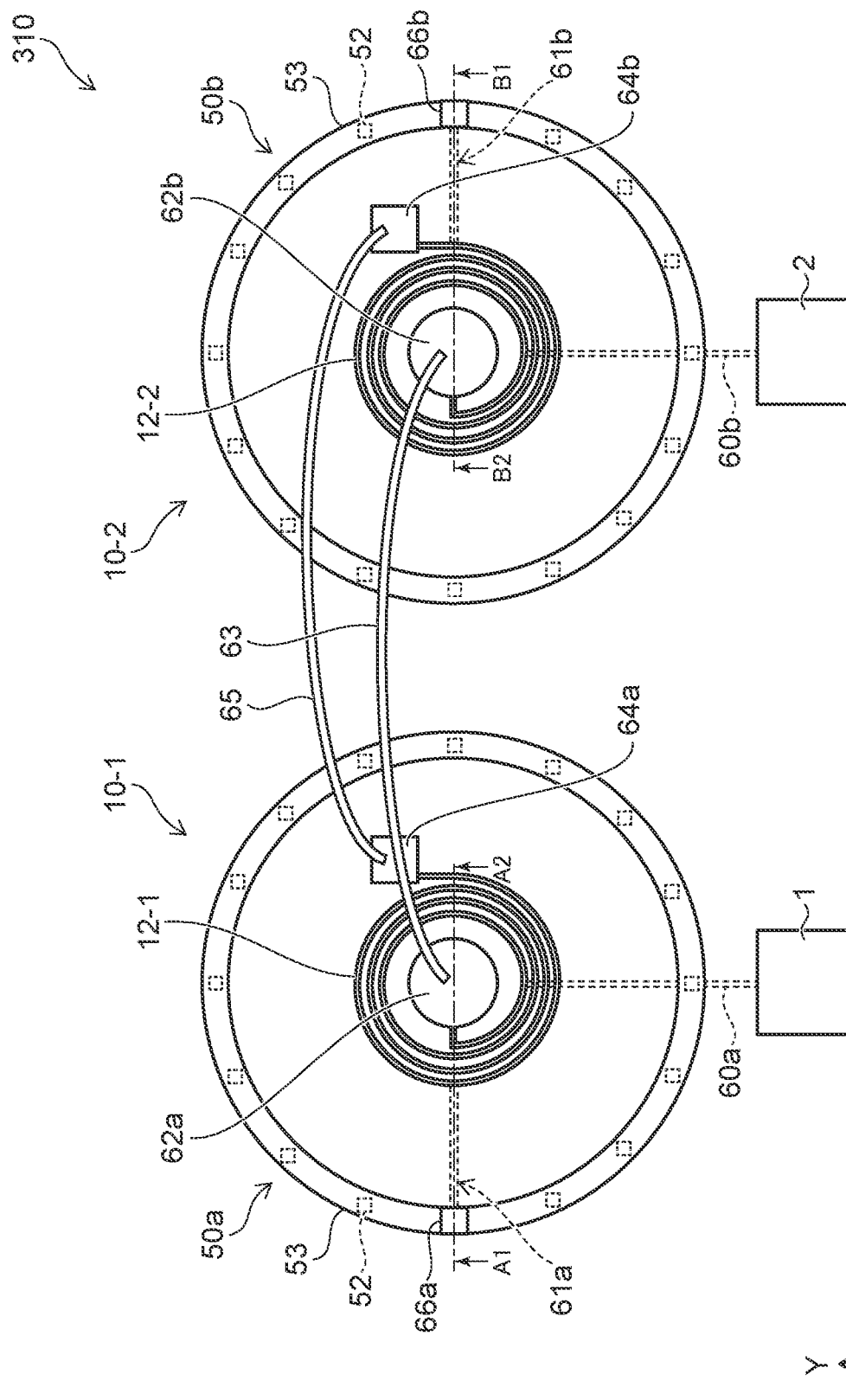
FIG. 19 is a plan view illustrating an isolator according to a first modification of the third embodiment.

FIG. 19 is a plan view illustrating an isolator 310 according to a first modification of the third embodiment.

Figure 20:
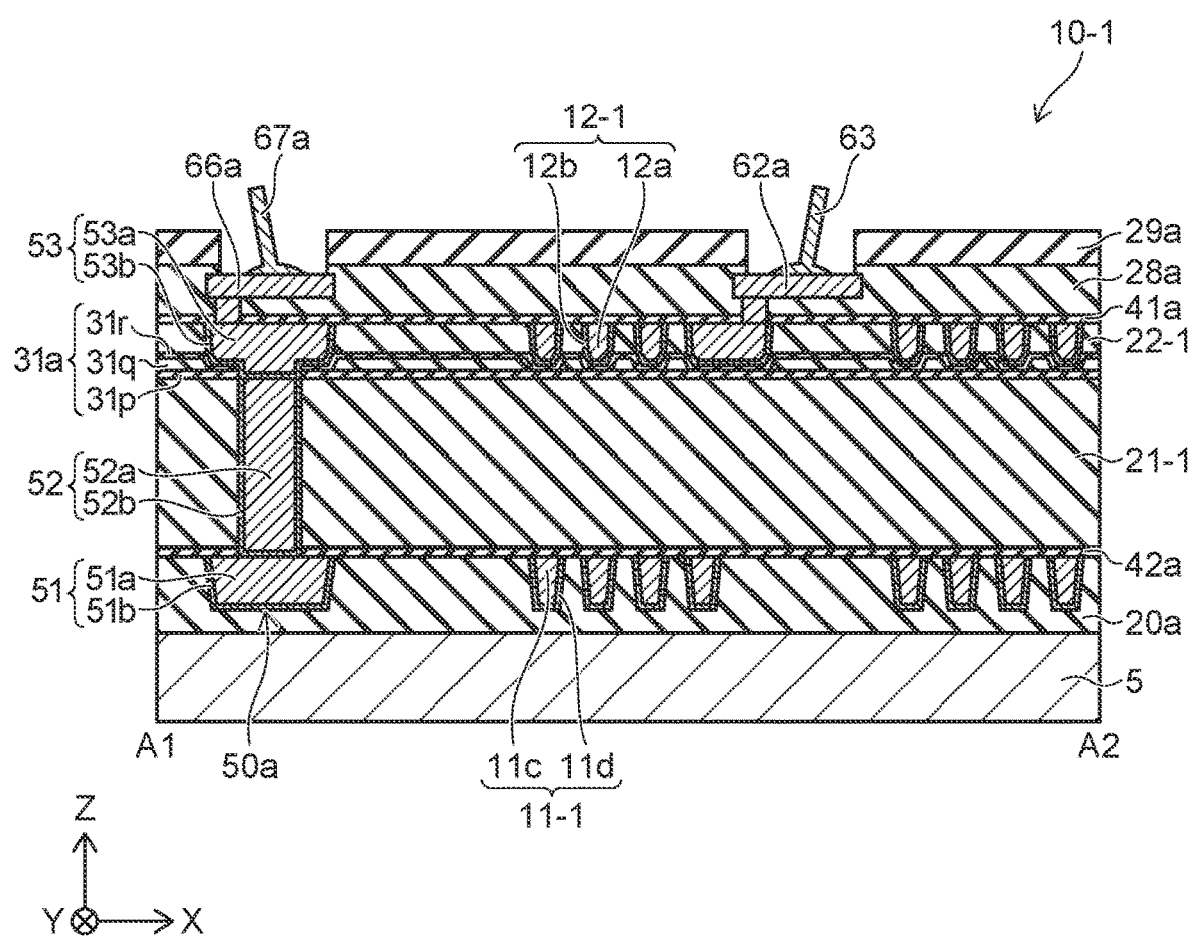
FIG. 20 is an A1-A2 cross-sectional view of FIG. 19.
Figure 21:
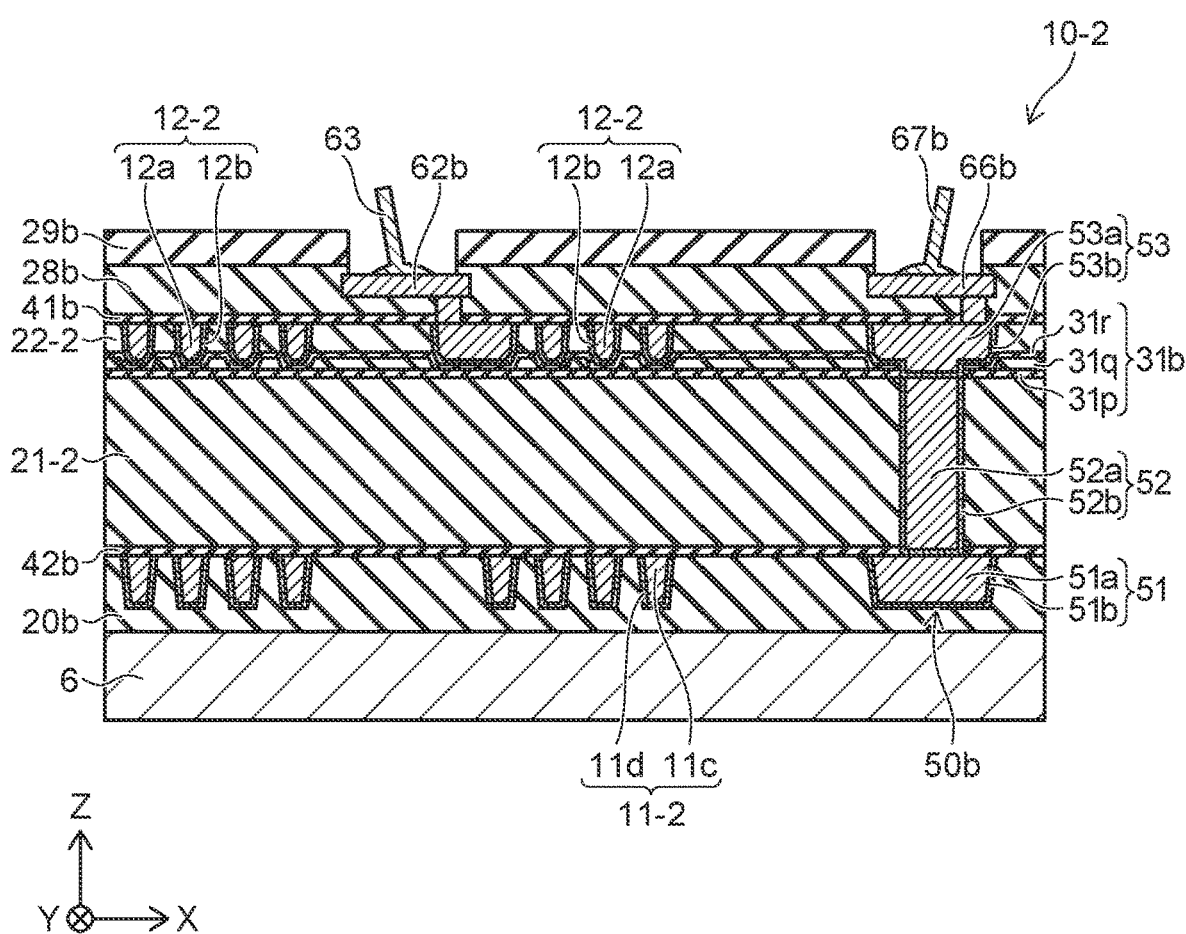
FIG. 21 is a B1-B2 cross-sectional view of FIG. 19.

FIG. 20 is an A1-A2 cross-sectional view of FIG. 19. FIG. 21 is a B1-B2 cross-sectional view of FIG. 19.

Figure 22:
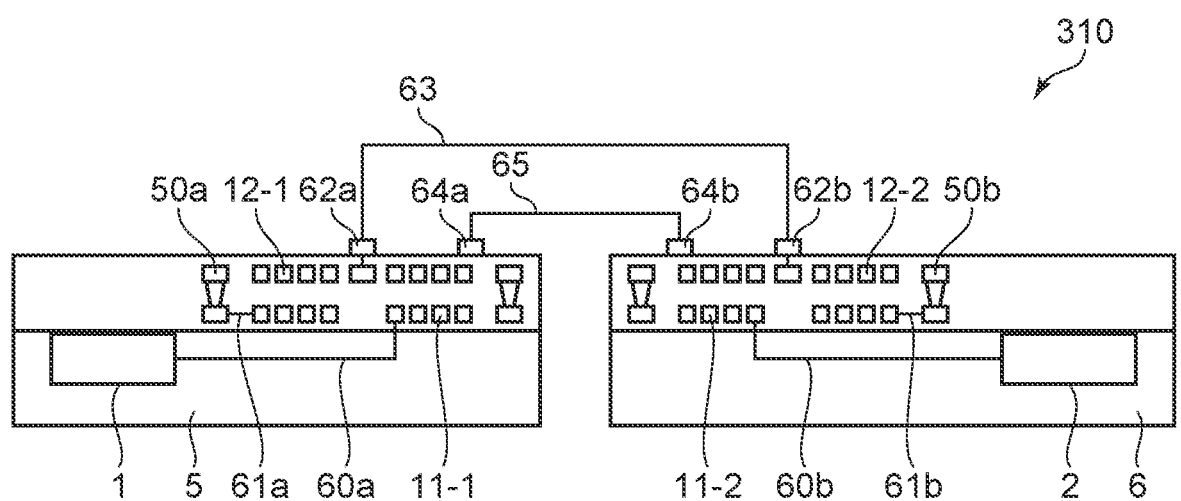
FIG. 22 is a schematic view illustrating the cross-sectional structure of the isolator according to the first modification of the third embodiment.

FIG. 22 is a schematic view illustrating the cross-sectional structure of the isolator 310 according to the first modification of the third embodiment.

The isolator 310 according to the first modification includes a first structure body 10-1 and a second structure body 10-2 as illustrated in FIG. 19.

The first structure body 10-1 includes an electrode 11-1, an electrode 12-1, an insulating portion 21-1, an insulating portion 22-1, a dielectric portion 31a, a dielectric portion 41a, a dielectric portion 42a, a conductive body 50a, a metal layer 62a, a metal layer 64a, and a metal layer 66a as illustrated in FIGS. 19, 20, and 22.

For example, the structures of the electrode 11-1, the electrode 12-1, the insulating portion 21-1, the insulating portion 22-1, the dielectric portion 31a, the dielectric portion 41a, the dielectric portion 42a, the conductive body 50a, the metal layer 62a, the metal layer 64a, and the metal layer 66a are respectively similar to the structures of the first electrode 11, the second electrode 12, the first insulating portion 21, the second insulating portion 22, the dielectric portion 31, the dielectric portion 41, the dielectric portion 42, the conductive body 50, the metal layer 62, the metal layer 64, and the metal layer 66 illustrated in FIG. 2.

The second structure body 10-2 includes an electrode 11-2, an electrode 12-2, an insulating portion 21-2, an insulating portion 22-2, a dielectric portion 31b, a dielectric portion 41b, a dielectric portion 42b, a conductive body 50b, a metal layer 62b, a metal layer 64b, and a metal layer 66b as illustrated in FIGS. 19, 21, and 22.

For example, the structures of the electrode 11-2, the electrode 12-2, the insulating portion 21-2, the insulating portion 22-2, the dielectric portion 31b, the dielectric portion 41b, the dielectric portion 42b, the conductive body 50b, the metal layer 62b, the metal layer 64b, and the metal layer 66b are respectively similar to the structures of the first electrode 11, the second electrode 12, the first insulating portion 21, the second insulating portion 22, the dielectric portion 31, the dielectric portion 41, the dielectric portion 42, the conductive body 50, the metal layer 62, the metal layer 64, and the metal layer 66 illustrated in FIG. 2.

As illustrated in FIG. 19, the metal layer 62a is electrically connected to the metal layer 62b by the wiring 63. The metal layer 64a is electrically connected to the metal layer 64b by the wiring 65.

The metal layer 66a is electrically connected to another conductive member by wiring 67a. The metal layer 66b is electrically connected to yet another conductive member by wiring 67b.

As illustrated in FIG. 22, the first circuit 1 is provided inside the substrate 5. The first structure body 10-1 is provided on the substrate 5. The second circuit 2 is provided inside the substrate 6. The second structure body 10-2 is provided on the substrate 6. One end of the electrode 11-1 is electrically connected to the conductive body 50a. The other end of the electrode 11-1 is electrically connected to the first circuit 1. One end of the electrode 11-2 is electrically connected to the conductive body 50b. The other end of the electrode 11-2 is electrically connected to the second circuit 2.

According to the embodiments, the structures described above are applicable to the structures of the isolator 310 provided above the substrate 5 and above the substrate 6. The electric field intensity can be reduced thereby in the vicinity of the lower edge at the end surface of the electrode 12-1. Also, the electric field intensity can be reduced in the vicinity of the lower edge at the end surface of the electrode 12-2. In the isolator 310 illustrated in FIGS. 19 to 22, the pair of electrodes 11-1 and 12-1 are connected in series to the pair of electrodes 11-2 and 12-2. In other words, the first circuit 1 and the second circuit 2 are doubly insulated from each other by two pairs of electrodes connected in series. According to the isolator 310, the insulation reliability can be improved, compared to the structure insulated singly by one pair of electrodes.

Figure 23:
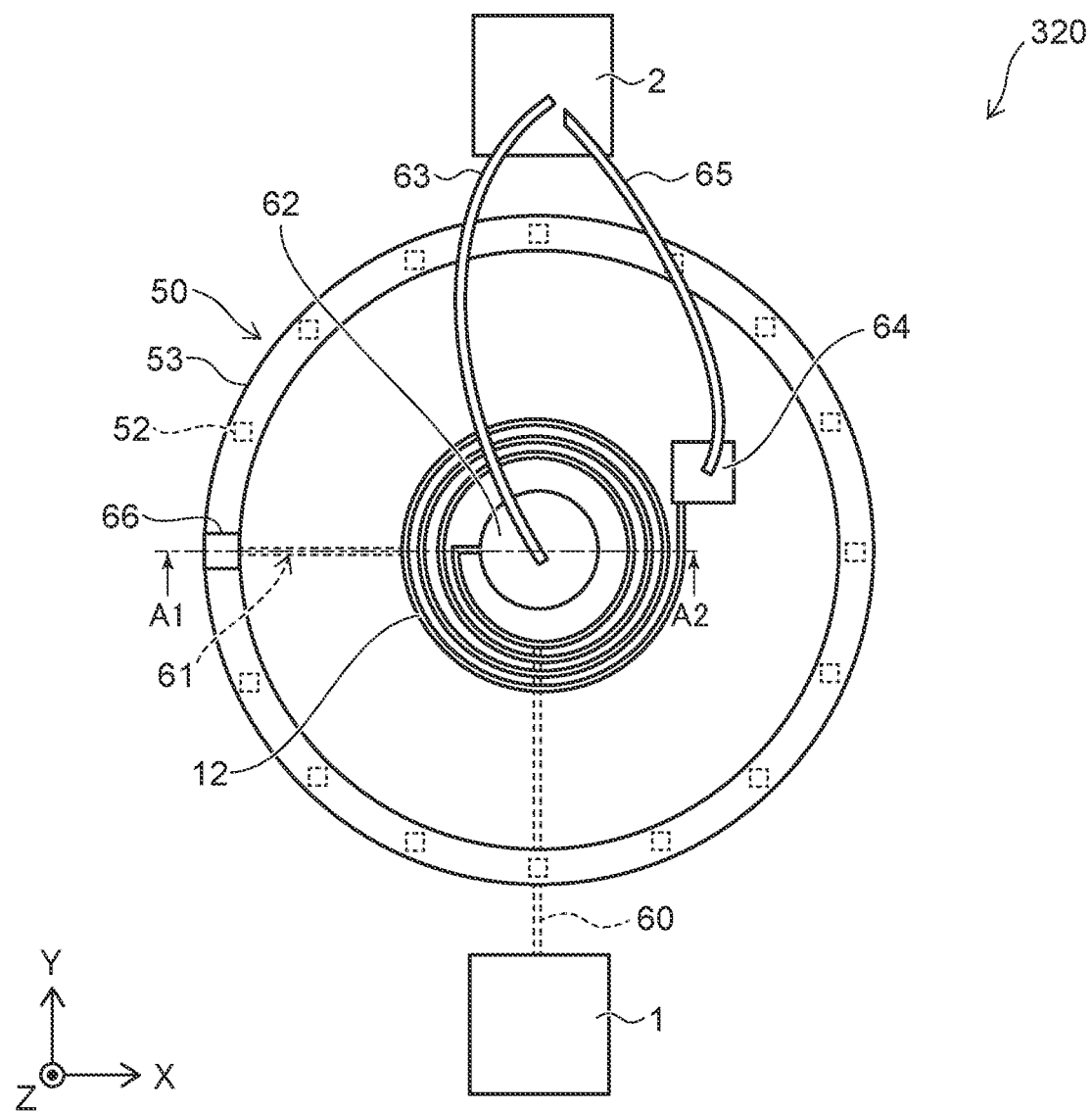
FIG. 23 is a plan view illustrating an isolator according to a second modification of the third embodiment.

FIG. 23 is a plan view illustrating an isolator 320 according to a second modification of the third embodiment.

Figure 24:
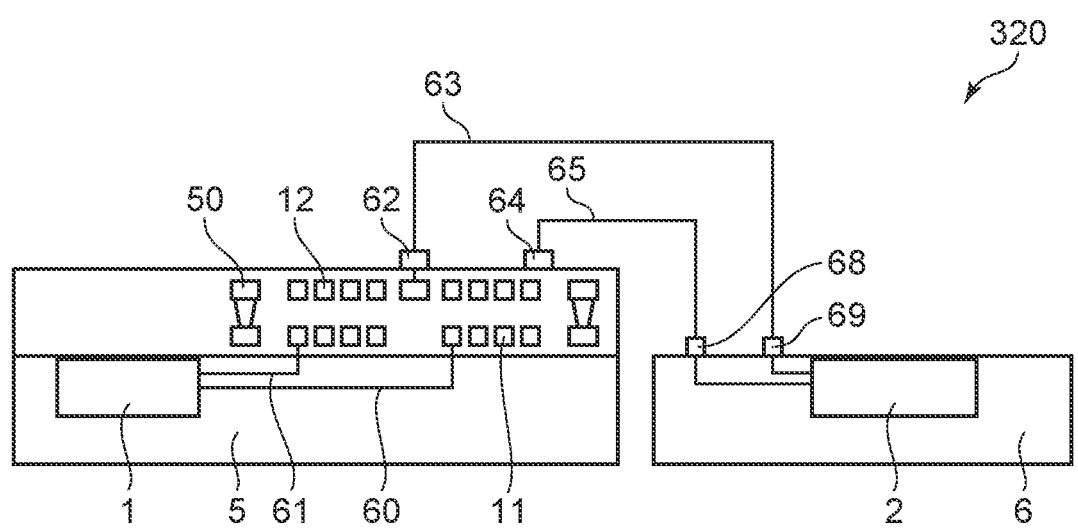
FIG. 24 is a schematic view illustrating the cross-sectional structure of the isolator according to the second modification of the third embodiment.

FIG. 24 is a schematic view illustrating the cross-sectional structure of the isolator 320 according to the second modification of the third embodiment.

According to the second modification of the third embodiment, as illustrated in FIGS. 23 and 24, the isolator 320 differs from the isolator 300 in that the two ends of the first electrode 11 are electrically connected to the first circuit 1. The conductive body 50 is electrically isolated from the first circuit 1 and the first electrode 11. As long as the conductive body 50 is set to the reference potential, the electrical connections of the first circuit 1, the first electrode 11, and the conductive body 50 can be modified appropriately therebetween.

Figure 25:
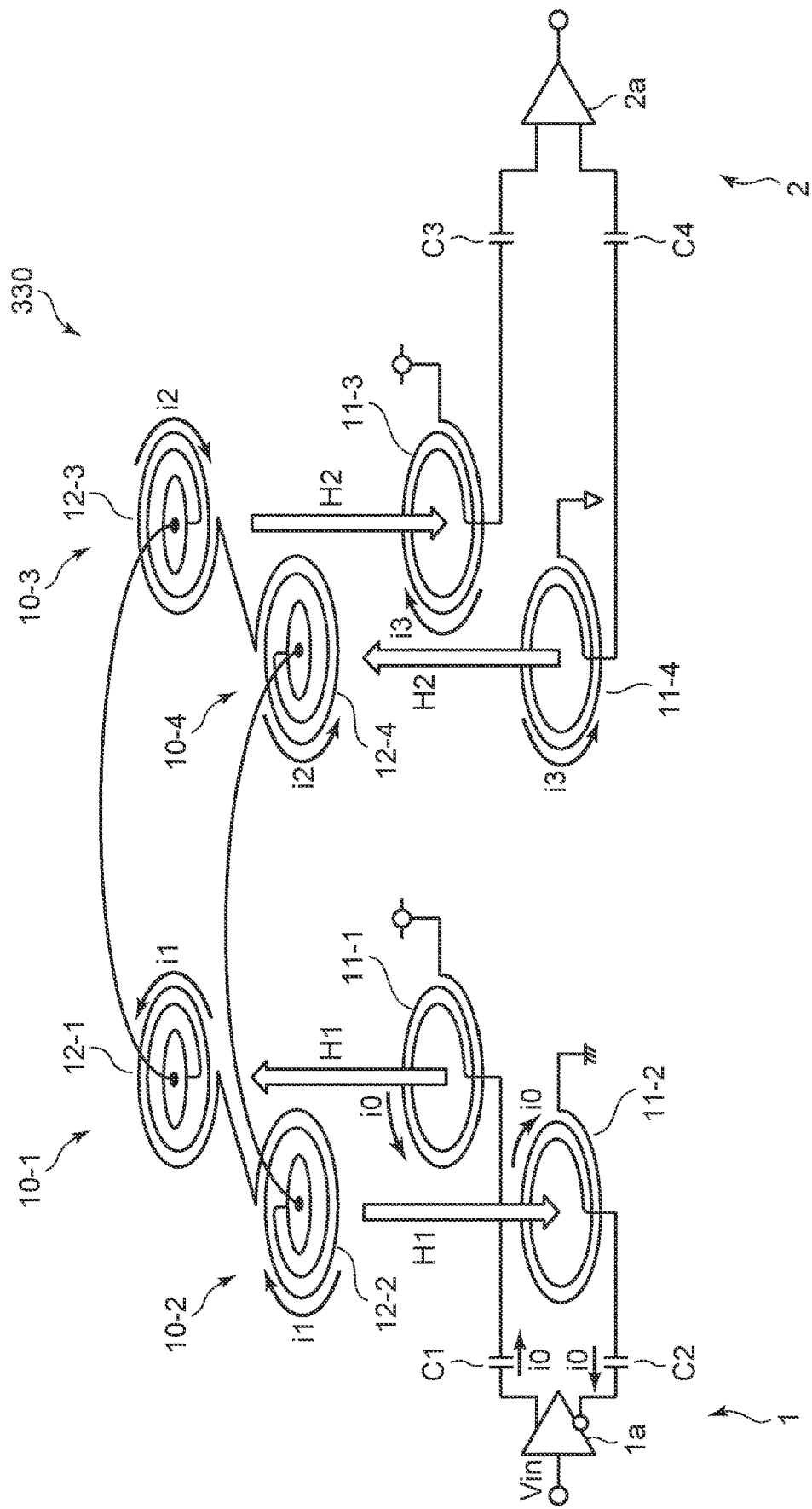
FIG. 25 is a schematic view illustrating an isolator according to a third modification of the third embodiment.

FIG. 25 is a schematic view illustrating an isolator 330 according to a third modification of the third embodiment.

The isolator 330 according to the third modification includes the first structure body 10-1, the second structure body 10-2, a third structure body 10-3, and a fourth structure body 10-4. The first structure body 10-1 includes the electrode 11-1 and the electrode 12-1. The second structure body 10-2 includes the electrode 11-2 and the electrode 12-2. The third structure body 10-3 includes an electrode 11-3 and an electrode 12-3. The fourth structure body 10-4 includes an electrode 11-4 and an electrode 12-4. The electrodes each are coils. The first circuit 1 includes a differential driver circuit 1a, a capacitance C1, and a capacitance C2. The second circuit 2 includes a differential receiving circuit 2a, a capacitance C3, and a capacitance C4.

For example, the differential driver circuit 1a, the capacitance C1, the capacitance C2, the electrode 11-1, the electrode 11-2, the electrode 12-1, and the electrode 12-2 are formed on a first substrate (not-illustrated). One end of the electrode 11-1 is connected to a first constant potential. The other end of the electrode 11-1 is connected to the capacitance C1. One end of the electrode 11-2 is connected to a second constant potential. The other end of the electrode 11-2 is connected to the capacitance C2.

One output of the differential driver circuit 1a is connected to the capacitance C1. The other output of the differential driver circuit 1a is connected to the capacitance C2. The capacitance C1 is connected to the differential driver circuit 1a and the electrode 11-1 therebetween. The capacitance C2 is connected to the differential driver circuit 1a and the electrode 11-2 therebetween.

The electrode 11-1 and the electrode 12-1 are stacked with an insulating portion interposed. The electrode 11-2 and the electrode 12-2 are stacked with another insulating portion interposed. One end of the electrode 12-1 is connected to one end of the electrode 12-2.

For example, the differential receiving circuit 2a, the capacitance C3, the capacitance C4, the electrode 11-3, the electrode 11-4, the electrode 12-3, and the electrode 12-4 are formed on a second substrate (not-illustrated). One end of the electrode 11-3 is connected to a third constant potential. The other end of the electrode 11-3 is connected to the capacitance C3. One end of the electrode 11-4 is connected to a fourth constant potential. The other end of the electrode 11-4 is connected to the capacitance C4.

One input of the differential receiving circuit 2a is connected to the capacitance C3. The other input of the differential receiving circuit 2a is connected to the capacitance C4. The electrode 11-3 and the electrode 12-3 are stacked with an insulating portion interposed. The electrode 11-4 and the electrode 12-4 are stacked with another insulating portion interposed. One end of the electrode 12-3 is connected to one end of the electrode 12-4. The other end of the electrode 12-3 is connected to the other end of the electrode 12-1. The other end of the electrode 12-4 is connected to the other end of the electrode 12-2.

An operation thereof will now be described. A modulated signal is transmitted in the isolators. In FIG. 25, Vin is the modulated signal. For example, an edge-triggered technique or on-off keying is used to modulate the signal. In any technique, Vin is the original signal shifted toward the high frequency band.

The differential driver circuit 1a causes a current i0 to flow through the electrode 11-1 and the electrode 11-2 in mutually-reverse directions. The current i0 corresponds to Vin. The electrodes 11-1 and 11-2 generate magnetic fields (H1) having mutually-reverse orientations. When the number of winds of the electrode 11-1 is equal to the number of winds of the electrode 11-2, the magnitudes of the generated magnetic fields are equal.

The induced voltage that is generated in the electrode 12-1 by a magnetic field H1 is added to the induced voltage generated in the electrode 12-2 by the magnetic field H1. A current i1 flows in the electrode 12-1 and 12-2. The electrode 12-1 and 12-2 are connected respectively to the electrode 12-3 and the electrode 12-4 by bonding wires. The bonding wires include, for example, gold. The diameters of the bonding wires are, for example, 30 μm.

The sum of the induced voltages of the electrodes 12-1 and 12-2 is applied to the electrodes 12-3 and 12-4. A current i2 flows in the electrodes 12-3 and 12-4. The current i2 is the same as the current i1 flowing in the electrode 12-1 and the electrode 12-2. The electrodes 12-3 and 12-4 generate magnetic fields (H2) having mutually-reverse orientations. When the number of winds of the electrode 12-3 is equal to the number of winds of the electrode 12-4, the magnitudes of the generated magnetic fields are equal.

The direction of the induced voltage generated in the electrode 11-3 by the magnetic field H2 is the reverse of the direction of the induced voltage generated in the electrode 11-4 by the magnetic field H2. A current i3 flows in the electrode 11-3 and 11-4. The magnitude of the induced voltage generated in the electrode 11-3 is equal to the magnitude of the induced voltage generated in the electrode 11-4. The sum of the voltages induced in the electrode 11-3 and 11-4 is applied to the differential receiving circuit 2a, and the modulated signal is transmitted thereto.

Figure 26:
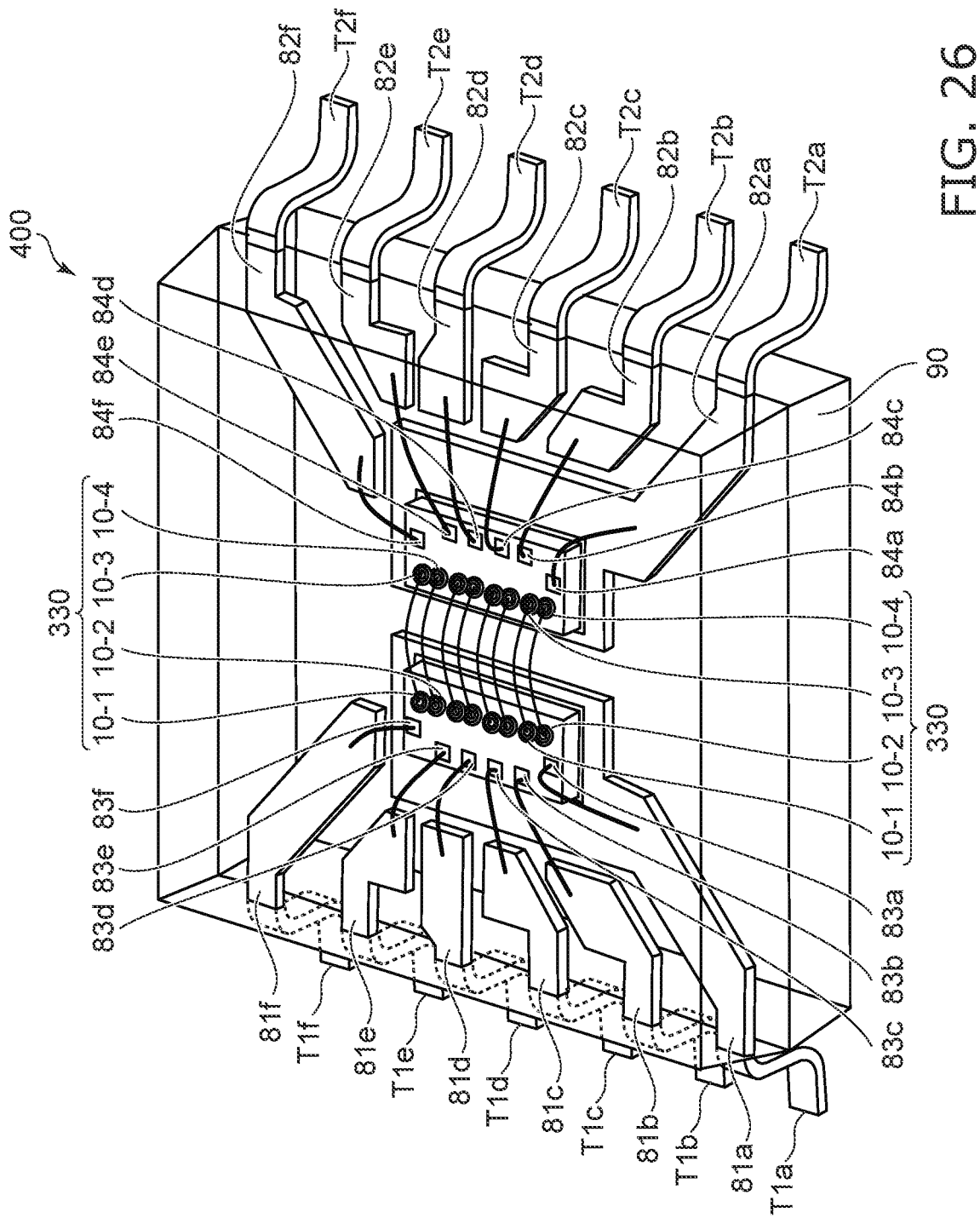
FIG. 26 is a perspective view illustrating a package according to a fourth embodiment.

FIG. 26 is a perspective view illustrating a package 400 according to a fourth embodiment.

Figure 27:
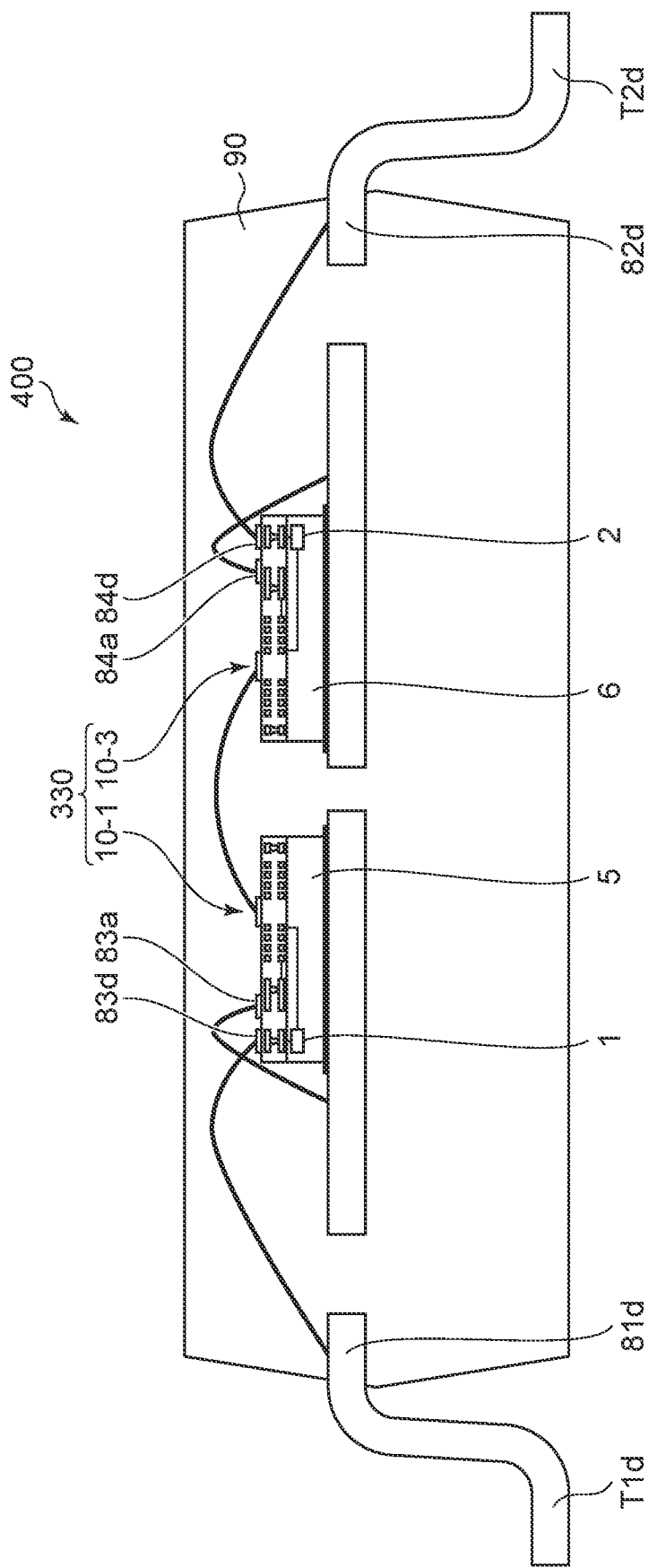
FIG. 27 is a schematic view illustrating the cross-sectional structure of the package according to the fourth embodiment.

FIG. 27 is a schematic view illustrating the cross-sectional structure of the package 400 according to the fourth embodiment.

According to the fourth embodiment, as illustrated in FIG. 26, the package 400 includes metal members 81a to 81f, metal members 82a to 82f, metal layers 83a to 83f, metal layers 84a to 84f, a sealing portion 90, and multiple isolators 330.

In the example illustrated, the package 400 includes four isolators 330. In other words, four sets of the first to fourth structure bodies 10-1 to 10-4 are provided, which are illustrated in FIG. 25.

The metal member 81a includes a portion on which the multiple first structure bodies 10-1 and the multiple second structure bodies 10-2 are provided. For example, the multiple first structure bodies 10-1 and the multiple second structure bodies 10-2 are provided on one substrate 5. The substrate 5 is electrically connected to the metal member 81a. Multiple first circuits 1 that correspond respectively to the first structure body 10-1 and the second structure body 10-2 are provided inside the substrate 5.

The metal member 82a includes a portion on which the multiple third structure bodies 10-3 and the multiple fourth structure bodies 10-4 are provided. The multiple third structure bodies 10-3 and the multiple fourth structure bodies 10-4 are provided on one substrate 6. The substrate 6 is electrically connected to the metal member 82a. Multiple second circuits 2 that correspond respectively to the third structure body 10-3 and the fourth structure body 10-4 are provided inside the substrate 6.

The metal member 81a is electrically connected to the metal layer 83a. The metal layer 83a is electrically connected to the conductive bodies 50a of the first structure body 10-1 and the second structure body 10-2. The metal member 82a is electrically connected to the metal layer 84a. The metal layer 84a is electrically connected to the conductive bodies 50b of the third structure body 10-3 and the fourth structure body 10-4.

The metal members 81b to 81e are electrically connected respectively to the metal layers 83b to 83e. The metal layers 83b to 83e are electrically connected respectively to the multiple first circuits 1. The metal member 81f is electrically connected to the metal layer 83f. The metal layer 83f is electrically connected to the multiple first circuits 1.

The metal members 82b to 82e are electrically connected respectively to the metal layers 84b to 84e. The metal layers 84b to 84e are electrically connected respectively to the multiple second circuits 2. The metal member 82f is electrically connected to the metal layer 84f. The metal layer 84f is electrically connected to the multiple second circuits 2.

The sealing portion 90 covers the multiple isolators 330, the metal layers 84a to 84f, the metal layers 83a to 83f, and portions of the metal members 81a to 81f and 82a to 82f.

The metal members 81a to 81f respectively include terminals T1a to T1f. The metal members 82a to 82f respectively include terminals T2a to T2f. The terminals T1a to T1f and T2a to T2f are not covered with the sealing portion 90 and are exposed externally.

For example, the terminals T1a and T2a are connected to a reference potential. Signals supplied to the first circuits 1 are input to the terminals T1b to T1e, respectively. Signals output from the second circuits 2 are output via the terminals T2b to T2e, respectively. The terminal T1f is connected to a power supply for driving the multiple first circuits 1. The terminal T2f is connected to a power supply for driving the multiple second circuits 2.

According to the fourth embodiment, it is possible to reduce the likelihood of the isolators broken in the package 400. Although an example is described in which four isolators 330 are provided, one or more other isolators may be provided in the package 400.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An isolator, comprising:
  a first electrode;
  a first insulating portion provided on the first electrode;
  a second electrode provided on the first insulating portion;
  a second insulating portion provided around the second electrode, the second insulating portion being provided along a first plane perpendicular to a first direction from the first electrode toward the second electrode, the second insulating portion contacting the second electrode;
  a first dielectric portion provided on the second electrode and the second insulating portion; and
  a second dielectric portion provided between the first and second insulating portions,
  the second electrode including a bottom surface facing the first insulating portion, an upper surface facing the first dielectric portion, and a side surface connected to the upper surface and the bottom surface;
  the second dielectric portion contacting the second electrode and including a first dielectric layer and a second dielectric layer, the first dielectric layer contacting the first insulating portion, the second dielectric layer being provided between the first dielectric layer and the second insulating portion, the first dielectric layer having a relative dielectric constant larger than a relative dielectric constant of the second dielectric layer, a relative dielectric constant of the first insulating portion and a relative dielectric constant of the second insulating portion.

2. The isolator according to claim 1, wherein
the second dielectric portion further includes a third dielectric layer between the second dielectric layer and the second insulating portion, the third dielectric layer having a relative dielectric constant larger than the relative electric constant of the second dielectric layer.

3. The isolator according to claim 2, wherein
the first dielectric layer is provided between the first insulating portion and the second electrode.

4. The isolator according to claim 3, wherein
the third dielectric layer is provided between the second electrode and the first dielectric layer, and contacts the bottom surface of the second electrode and the first dielectric layer.

5. The isolator according to claim 2, wherein
the bottom surface of the second electrode contacts the first insulating portion.

6. The isolator according to claim 5, wherein
the second dielectric layer contacts the side surface of the second electrode.
7. The isolator according to claim 1, wherein
the first dielectric layer is provided between the first insulating portion and the second electrode.
8. The isolator according to claim 1, wherein
the bottom surface of the second electrode contacts the first insulating portion.
9. The isolator according to claim 8, wherein
the second dielectric layer and the first dielectric layer contact the side surface of the second electrode.
10. The isolator according to claim 8, wherein
a bottom surface of the first dielectric layer and the bottom surface of the second electrode are contacted on an upper surface of the first insulating portion, and disposed on a plane parallel to the first plane.
11. The isolator according to claim 1, wherein
the upper surface is wider than the bottom surface in a second direction along the first plane.

* * * * *